United States Patent
Koyama et al.

(10) Patent No.: US 7,276,693 B2
(45) Date of Patent: *Oct. 2, 2007

(54) INSPECTION METHOD AND APPARATUS USING CHARGED PARTICLE BEAM

(75) Inventors: Hikaru Koyama, Tokorozawa (JP); Hidetoshi Nishiyama, Higashiyamato (JP); Mari Nozoe, Hino (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/375,070

(22) Filed: Mar. 15, 2006

(65) Prior Publication Data

US 2006/0163480 A1 Jul. 27, 2006

Related U.S. Application Data

(63) Continuation of application No. 11/002,124, filed on Dec. 3, 2004, now Pat. No. 7,019,294.

(30) Foreign Application Priority Data

Dec. 4, 2003 (JP) .............................. 2003-405332

(51) Int. Cl.
*G01N 23/00* (2006.01)
*H01J 37/20* (2006.01)
*H01J 37/22* (2006.01)
*H01J 37/28* (2006.01)

(52) U.S. Cl. ...................... 250/310; 250/306; 250/307; 250/309; 250/311

(58) Field of Classification Search ................. 250/310, 250/311
See application file for complete search history.

(56) References Cited

U.S. PATENT DOCUMENTS

| 6,300,629 | B1 * | 10/2001 | Lawrence | .................... | 250/310 |
| 6,825,475 | B2 * | 11/2004 | Petrov et al. | ........ | 205/396 ML |
| 7,019,294 | B2 * | 3/2006 | Koyama et al. | ............ | 250/311 |
| 7,067,807 | B2 * | 6/2006 | Petrov et al. | ............... | 250/307 |
| 7,138,629 | B2 * | 11/2006 | Noji et al. | .................. | 250/311 |
| 2002/0028399 | A1 * | 3/2002 | Nakasuji et al. | .............. | 430/30 |

(Continued)

FOREIGN PATENT DOCUMENTS

JP       06-0338280       12/1994

(Continued)

*Primary Examiner*—Robert Kim
*Assistant Examiner*—Bernard Souw
(74) *Attorney, Agent, or Firm*—Antonelli, Terry, Stout & Kraus, LLP.

(57) ABSTRACT

A scanning electron microscope or inspection system includes a sample stage on which a sample such as a wafer is loaded, an electro optical unit to scan an electron beam to the sample, and a charge control electrode to which voltage for controlling a charged state of the sample is applied. Further, there is provided an ultraviolet irradiation device for irradiating ultraviolet light onto the sample, a retarding electric source to apply a retarding voltage to the sample stage or the sample, and a detection unit for detecting secondary electrons or backscattering electrons generated in response to the scan of the electron beam. A monitoring unit for displaying an image of the sample or an inspection unit for inspection of the sample is provided which effects display or inspection based on signals from the detection unit.

19 Claims, 23 Drawing Sheets

U.S. PATENT DOCUMENTS

| | | |
|---|---|---|
| 2002/0033449 A1* | 3/2002 | Nakasuji et al. ............ 250/306 |
| 2002/0130262 A1 | 9/2002 | Nakasuji |
| 2003/0057971 A1* | 3/2003 | Nishiyama et al. ......... 324/751 |
| 2004/0056207 A1* | 3/2004 | Petrov et al. ........ 250/396 ML |
| 2005/0045821 A1* | 3/2005 | Noji et al. .................. 250/311 |
| 2005/0174140 A1 | 8/2005 | Iwasaki |
| 2005/0190310 A1 | 9/2005 | Koyama |
| 2005/0218325 A1* | 10/2005 | Nishiyama et al. ......... 250/311 |
| 2006/0049348 A1* | 3/2006 | Petrov et al. ............... 250/307 |
| 2006/0163477 A1* | 7/2006 | Nozoe et al. ............... 250/310 |
| 2006/0163480 A1* | 7/2006 | Koyama et al. ............ 250/310 |
| 2006/0169900 A1* | 8/2006 | Noji et al. .................. 250/310 |
| 2006/0289755 A1* | 12/2006 | Koyama et al. ............ 250/310 |
| 2007/0040118 A1* | 2/2007 | Cheng et al. ............... 250/310 |

FOREIGN PATENT DOCUMENTS

| | | |
|---|---|---|
| JP | 11-121561 | 4/1999 |
| JP | 2000-208085 | 7/2000 |
| JP | 2002-270655 | 9/2002 |
| JP | 2003-151483 | 5/2003 |

* cited by examiner

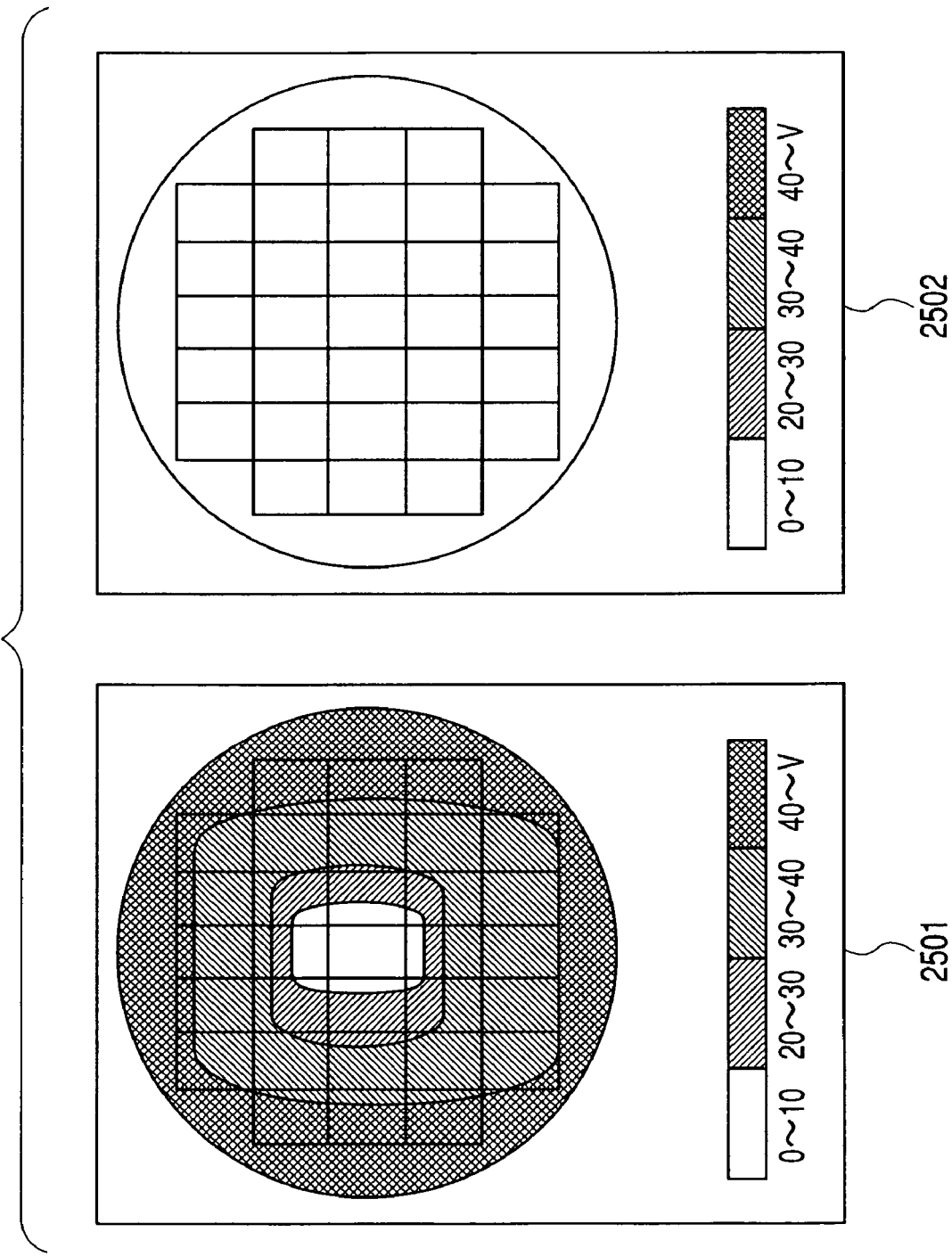

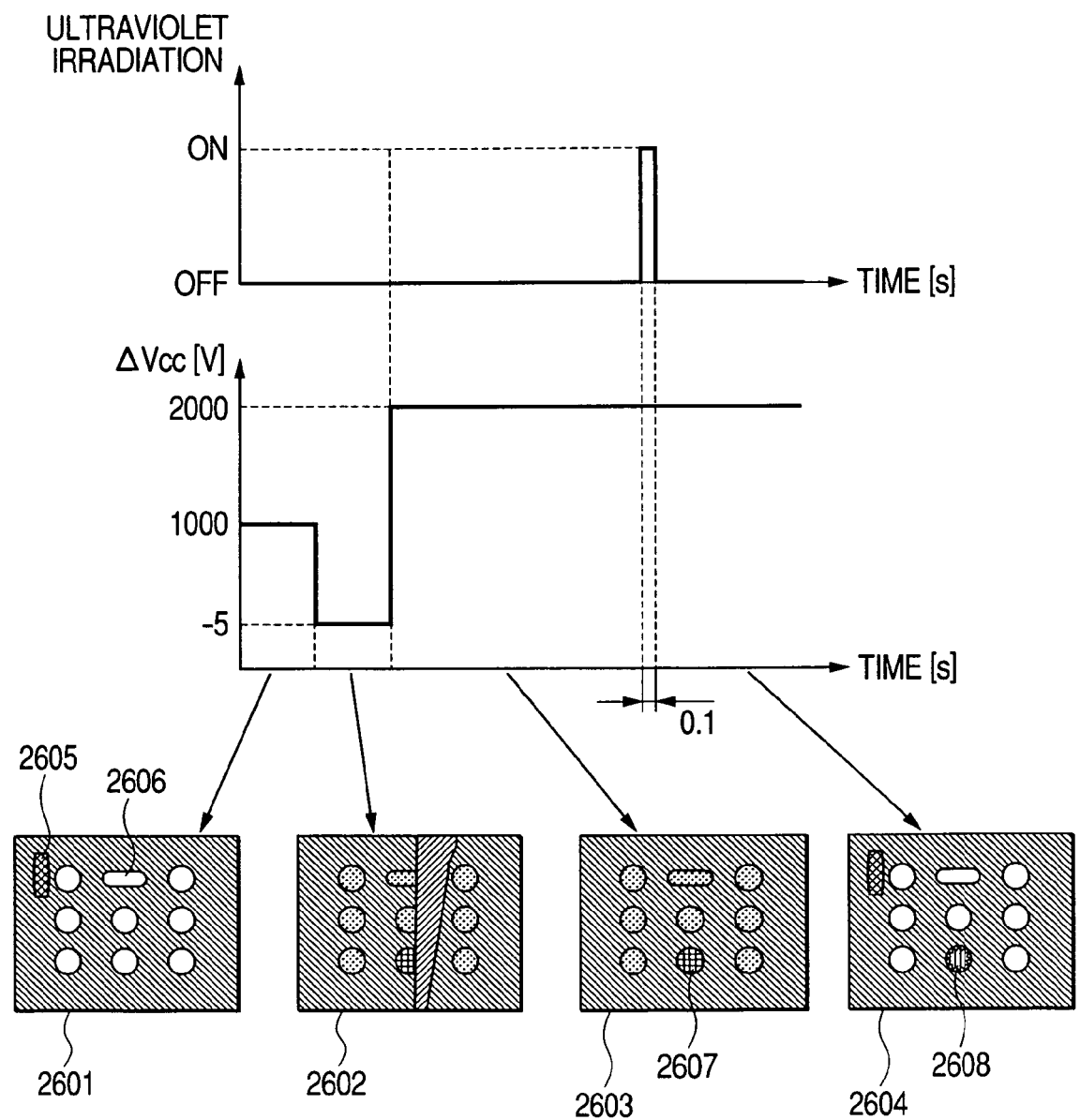

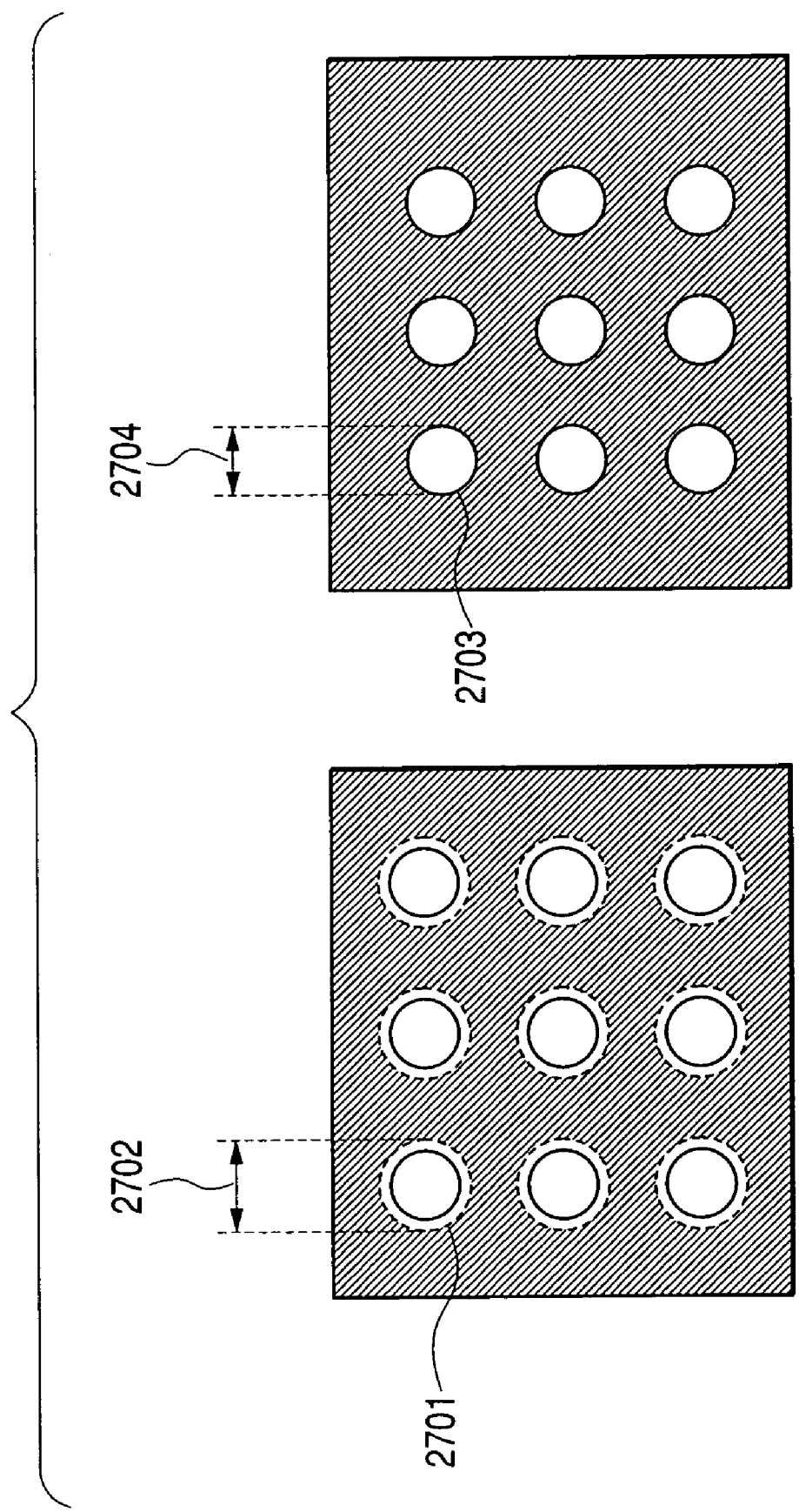

INSPECTION METHOD AND APPARATUS USING CHARGED PARTICLE BEAM

CROSS REFERENCE TO RELATED APPLICATION

This application is a continuation of U.S. application Ser. No. 11/002,124, filed Dec. 3, 2004, now U.S. Pat. No. 7,019,294, the contents of which are incorporated herein by reference.

CLAIM OF PRIORITY

The present application claims priority from Japanese application JP 2003-405332 filed on Dec. 4, 2003, the content of which is hereby incorporated by reference into this application.

BACKGROUND OF THE INVENTION

1. Field of the Invention

This invention generally relates to the method and apparatus for manufacturing substrates having fine circuit patterns, such as semiconductor devices or liquid crystals, especially to the technology for the inspection of patterns for semiconductor devices or photo masks. Further in particular, it relates to the inspection method and apparatus using a charged particle beam for the inspection of defects in any portion on an unfinished semiconductor wafer in the manufacturing process of a semiconductor device.

2. Description of the Related Art

A semiconductor device is produced by repeating the processes of printing a pattern formed on a photo-mask onto a wafer through lithography and etching processes. For the inspection of such patterns, there is a technology of identifying defects in a wafer pattern by acquiring a SEM image (an image of potential contrast) of the wafer pattern and then comparing it with an image of neighboring another pattern. Since the picture quality of a voltage contrast image is seriously affected by charge conditions of the object of inspection, charge control is very important with the wafer-pattern inspection technology using a SEM image.

For charging a wafer, 1) the method of irradiating an electron beam to a wafer, and 2) the method of using a charge control electrode, are the measures to be used. The principles of these methods are explained below.

In the former method 1), the electron energy of an electron beam is controlled so that the efficiency of secondary electron emission generated by the irradiation of an electron beam to a wafer reaches a predetermined value. The charge polarity is determined by the efficiency of the secondary electron emission; if the efficiency of the secondary electron emission is larger than 1, the charge will be positive, and if smaller than 1, the charge will be negative. The relation between the efficiency of the secondary electron emission and electron energy is shown in FIG. 7.

In the latter method 2), the charge polarity is controlled by controlling the potential applied to the charge control electrode relative to the wafer. If the charge control electrode is charged with a positive voltage relative to the wafer, the wafer will be positively charged, and if with a negative voltage, the wafer will be negatively charged. That is, if an electrical field that will draw up the secondary electrons emitted from the wafer field is generated, the wafer will be charged positive, and if an electrical field that will draw back the electrons is generated, the wafer will be charged negative.

When charging the surface of a wafer, it is necessary to charge an inspection area evenly. If the wafer surface is unevenly charged, the trajectory of the secondary electron is largely bent, and the detection efficiency of secondary electrons is affected. As the result, for example, obtained images could be distorted and have fluctuated or uneven brightness and the defect inspection accuracy will be deteriorated. As for the causes of uneven charge in the wafer surface, (1) The case that the method of generating negative charge is the cause,
(2) The case that the circuit pattern formed on the wafer surface is the cause, are the possible cases.

These two cases are explained below;

First, the reason the method of generating negative charge can be the cause of an uneven charge is explained. A method of using a charge control electrode for generating a negative charge is described in the JP H11-121561A.

As shown in FIG. 5, in the method described, by charging a negative voltage to an electrode (charge control electrode 807) set up just above a wafer, a potential barrier is formed just above the wafer so that the secondary electrons 809 generated by irradiating an electron beam 801 are pulled back to the wafer and adhere to the surface of the wafer, which thereby gets charged negatively. In this method, only the area irradiated by the electron beam gets negatively charged, so that an electrical field is generated between the irradiation area and its surrounding area that is not negatively charged. This electrical field spreads the electrons adhering to the wafer surface, eliminating the difference in potentials and thus difference in contrast between a defective portion and a normal portion, and degrading inspection accuracy.

Next, with reference to FIG. 5 and FIG. 6, the reason why a circuit pattern formed on a wafer surface causes uneven charging will be explained. As shown in FIG. 6, suppose an inspection area on the left half of which plugs are formed as a circuit pattern and the right half of which has no pattern. When the secondary electrons are pulled back onto a pattern like this, plugs 804 in FIG. 5 do not charge because they are conductive to the substrate 802, but the insulating film 803 charges negatively. With the pattern shown in FIG. 6, the left half having dense plugs has a higher charge potential than the right half having no pattern. Because of the difference in charge potentials between the left half and the right half, an electric field is generated and the secondary electron trajectories are bent. Therefore, when a voltage contrast image 902 is acquired for the wafer pattern 901, shading occurs, which degrades the defect inspection accuracy.

With the cases (1) and (2) explained above, uneven charges occurred at the time of performing a pattern inspection. However, a wafer can already have a charge before being inspected with an inspection apparatus. Such a charge, as being the result of the wafer's coming through various fabrication processes, is uneven and hard to tell even whether positive or negative.

As a method of charge control to even an uneven charge, a pre-charge method using ultraviolet or electron beam irradiation is known.

A charge control method using ultraviolet irradiation is, for instance, described in JP 2003-151483A. In this technology, an even charge is attained by removing electrons accumulated in a sample through ultraviolet irradiation that causes photoelectric emission or renders the surface of the sample conductive.

Another method of charge control by pre-charging is disclosed, for example, in JP2000-208085A. In the invention described in JP2000-208085A, the surrounding area of an image acquiring target area is negatively charged (pre-charge) before acquiring an image using an electron source different from the electron source for acquiring images. Then, by irradiating an electron beam emitted from the electron source for image acquisition, an image is acquired. The electron energy of the electron beam emitted from the electron source for pre-charging is controlled so that the emission efficiency of the secondary electrons is below 1.

SUMMARY OF THE INVENTION

As described above, following are the problems with controlling the charge of an inspection sample:
(1) Charges can be uneven depending on the circuit patterns in the area for charge control or on the method of charge control,
(2) A wafer can be already unevenly charged before it is carried into the charged particle beam apparatus, the polarity of the charge being unknown.

These problems would cause troubles of shading, image distortion and focus deviation or aberration, etc. These troubles of shading, image distortion and focus deviation, etc. would cause various secondary problems for apparatuses utilizing secondary electron images, for example, degradation of defects inspection accuracy with a SEM type appearance inspection apparatus, degradation of inspection throughput caused by decreased voltage contrast with a review SEM, and degradation of measuring accuracy caused by decreased contrast with a measuring SEM.

With the technology of performing a charge control by ultraviolet irradiation described in JP 2003-151483A, it is possible to change the charge of a wafer from negative to positive, but not vice versa. Also, with the technology of controlling charges by pre-charging disclosed in JP 2000-208085A, for getting a wafer charged evenly, it is necessary to know the charge distribution on the wafer before performing a pre-charge operation, making it difficult to generate a desired charge. For example, when a wafer was topically or locally charged, it was difficult to control charging so as for a particular area of the wafer to have a selected charge because the quantity of electric charge and irradiation energy required for the charge control was unknown.

This invention, by controlling the charge of an inspection sample to be more uniform than before, aims to realize an inspection apparatus and method using a charged particle beam that enables acquisition of voltage contrast images of higher quality and provides better inspection and measurement accuracy than conventional ones.

The inventors of this invention came to the conclusion that, to realize more even charge control, it is necessary to resolve the following three problems:
(i) An accurate charge control to attain a uniform potential across a wafer is required.
(ii) Accommodation to either of positive and negative polarity is required.
(iii) When acquiring an image, effective detection of the secondary electrons is required.

This invention, to cope with the problems (i) and (ii) above, attains a uniform charge across a wafer by performing ultraviolet irradiation in coordination with the operation of the charge control electrode, and then, to solve the problem (iii) above, when acquiring a voltage contrast image, applies a positive voltage on to the charge control electrode. These measures solve the problems (i) to (iii) above and attain charge control with better uniformity than conventional technologies This invention solves the conventional problem in the inspection process of a partly completed substrate of a semiconductor device that the accuracy of inspection is degraded due to shading on images caused by the charge the substrate had before inspection. Using ultraviolet light instead of an electron beam for charge removal and operating it in coordination with the operation of the charge control electrode enabled control to have a uniform charge over a broad area of the substrate. Further, the improvement of a method of acquiring a image without generating any shading will improve the accuracy of inspection.

BRIEF DESCRIPTION OF THE DRAWINGS

FIG. 22 illustrates a potential distribution in a wafer plane.

FIG. 23 illustrates an example of the inspection process with a review SEM

FIG. 24 illustrates an example of an image acquired with a measuring SEM.

DETAILED DESCRIPTION OF THE PREFERRED EMBODIMENTS

Figure 8:
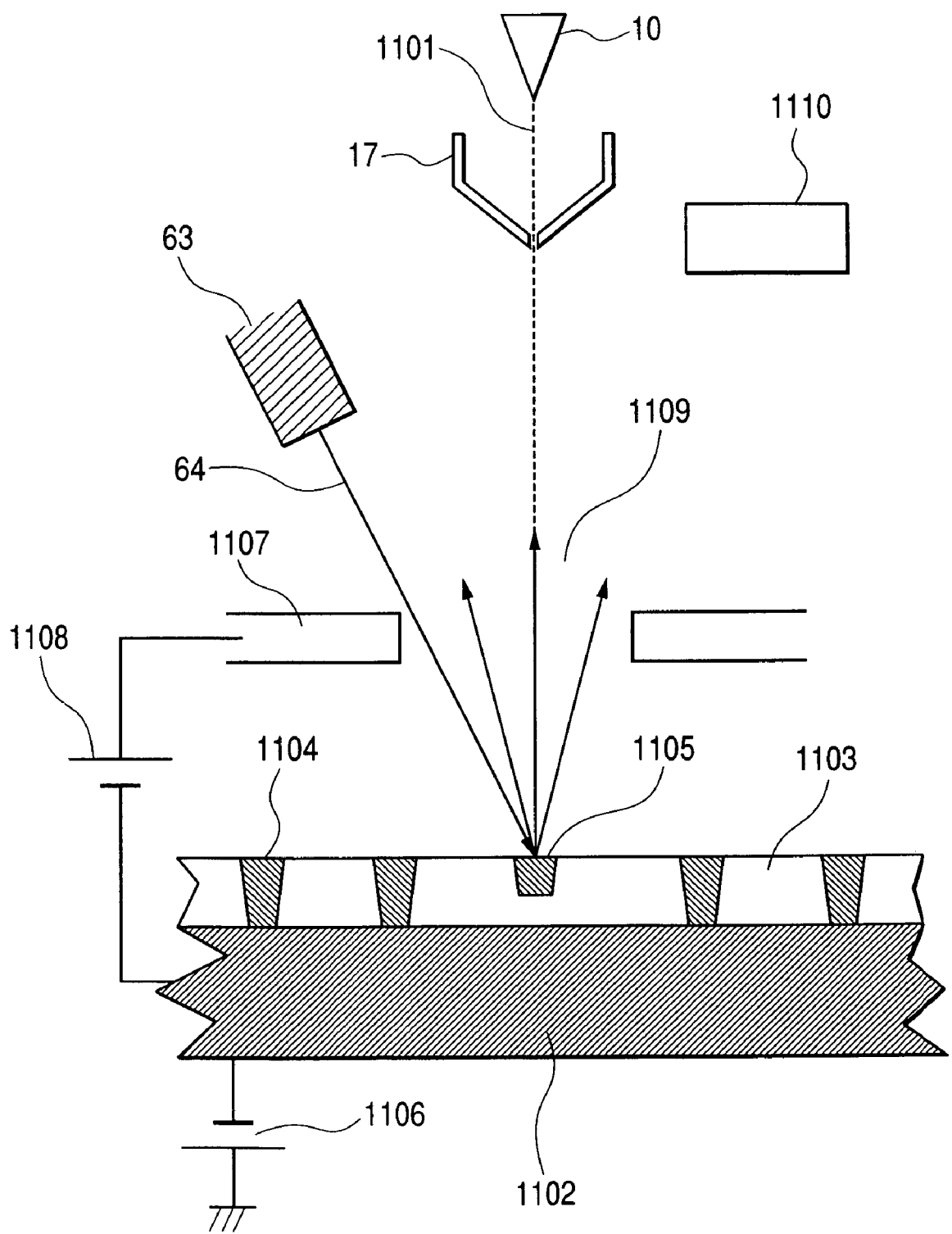
FIG. 8 illustrates the principle for acquiring a positive voltage contrast image by ultraviolet irradiation.

FIG. 8 illustrated the principle of charge control operation by coordination of ultraviolet irradiation and charging a positive potential to a charge control electrode.

When ultraviolet light is irradiated onto a wafer 1102, a charge control electrode 1107 is charged to a desired potential. When the charge control electrode 1107 is charged with a positive voltage from a charge control electric source 1108, photoelectrons 1109 produced by the ultraviolet irradiation are attracted by the positive electrical field generated by the positive potential charge to the charge control electrode and are drawn up from the wafer. Therefore, the wafer will have a positive charge by losing those photoelectrons.

Figure 9:
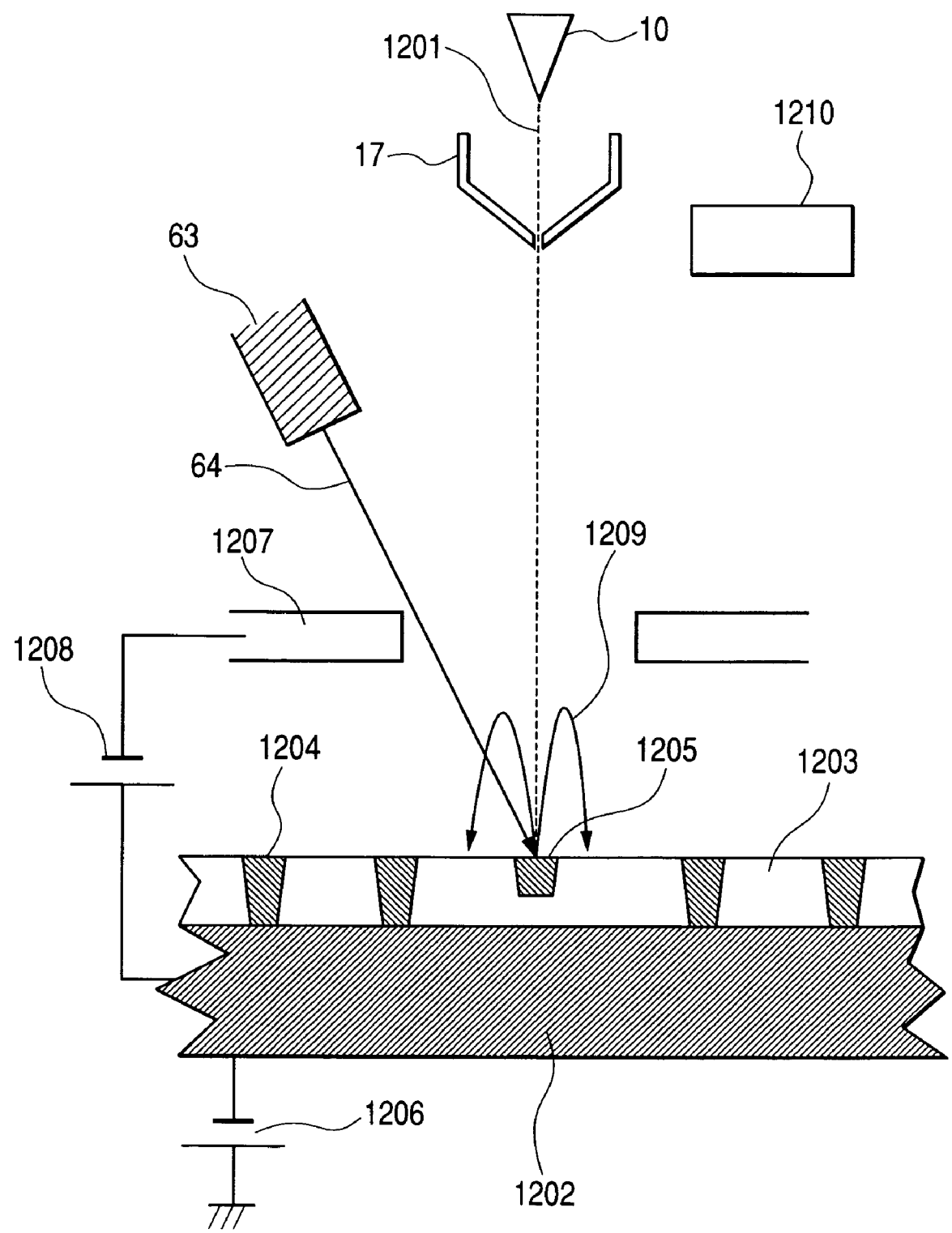
FIG. 9 illustrates the principle for acquiring a negative voltage contrast image by ultraviolet irradiation.

FIG. 9 illustrates the principle of charge control operation by coordination of ultraviolet irradiation and charging a negative or positive potential to a charge control electrode. When ultraviolet light 64 is irradiated onto a wafer 1202, pairs of an electron and hole are generated in the wafer. While holes diffuse through the wafer and get recombined, electrons are emitted into a vacuum. At this point in time, if a charge control electrode 1207 has been charged with a negative voltage by a charge control electric source 1208, the negative field generated around the electrode will cause photoelectrons 1209 to be pulled back to the wafer. The photoelectrons caused to be pulled back by the charge control electrode are captured at the surface level and are located on the surface of the wafer, which as a whole is charged negative.

Figure 10:
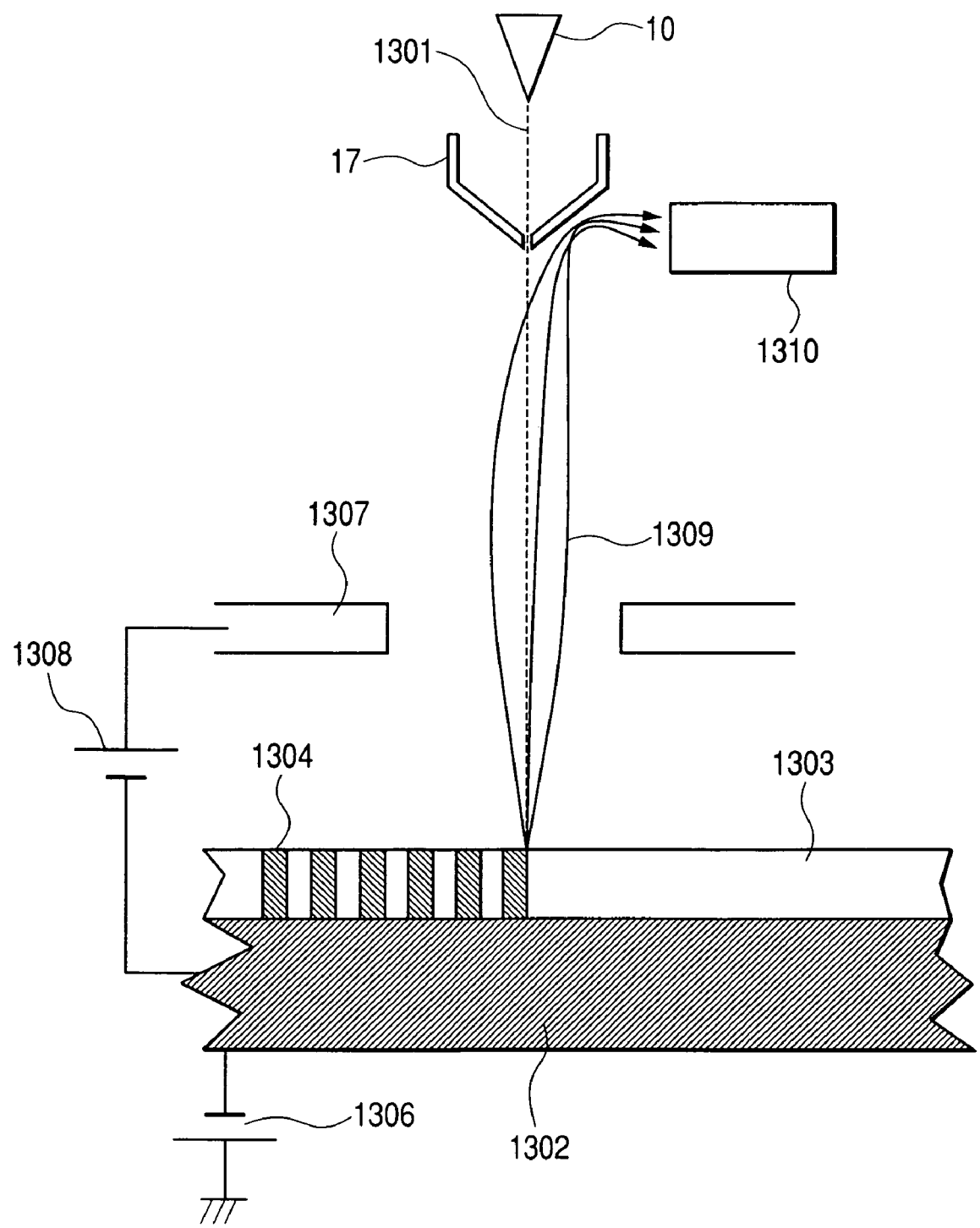
FIG. 10 illustrates the principle for acquiring an image without shading.
Figure 11:
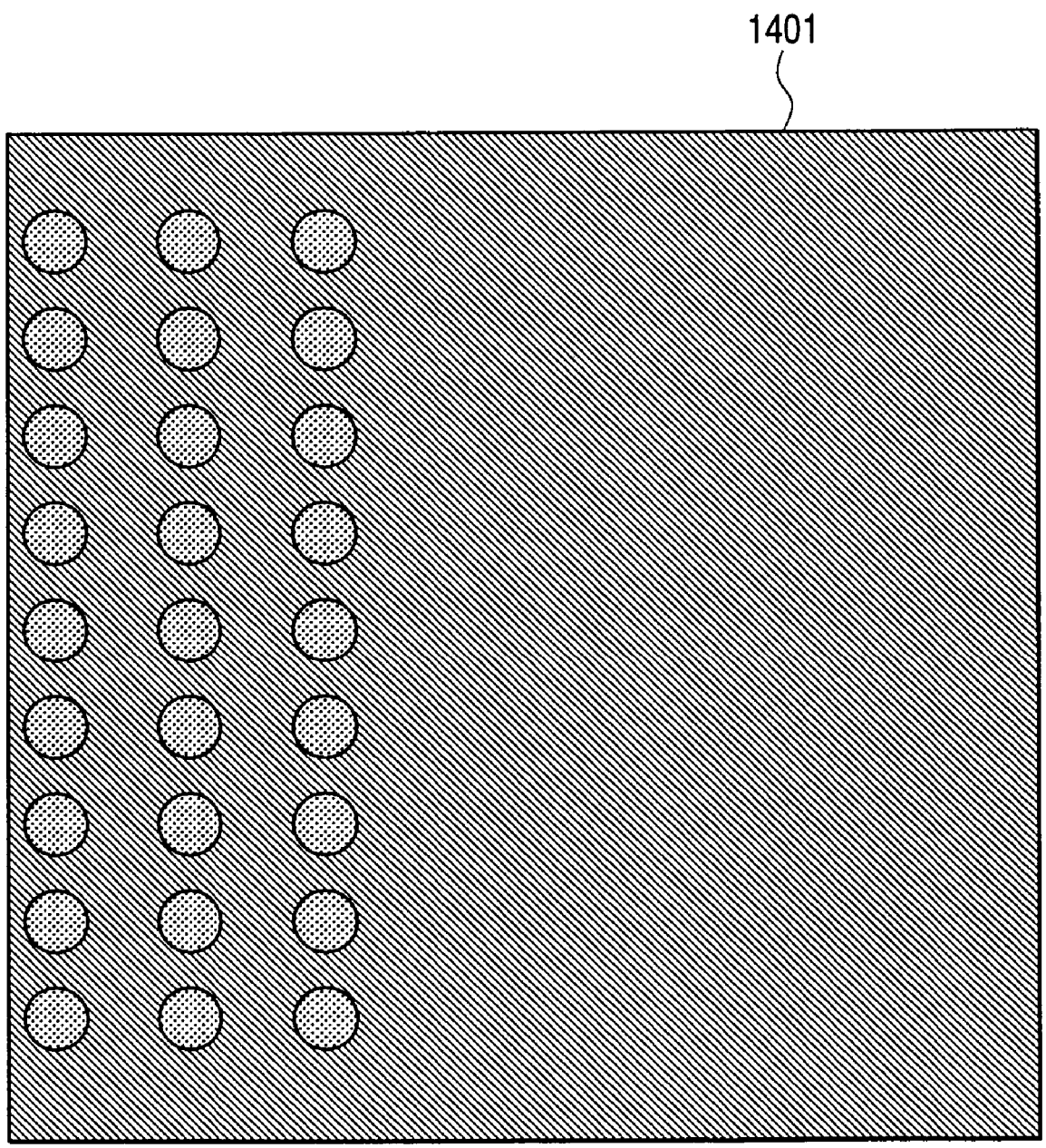
FIG. 11 shows a voltage contrast image without shading.

When the charge control electrode is charged with a positive potential, there is also a side effect that the efficiency of secondary electron detection is improved. FIG. 10 illustrates how this works. As the result, images 1401 without shading as shown in FIG. 11 can be obtained.

Figure 12:
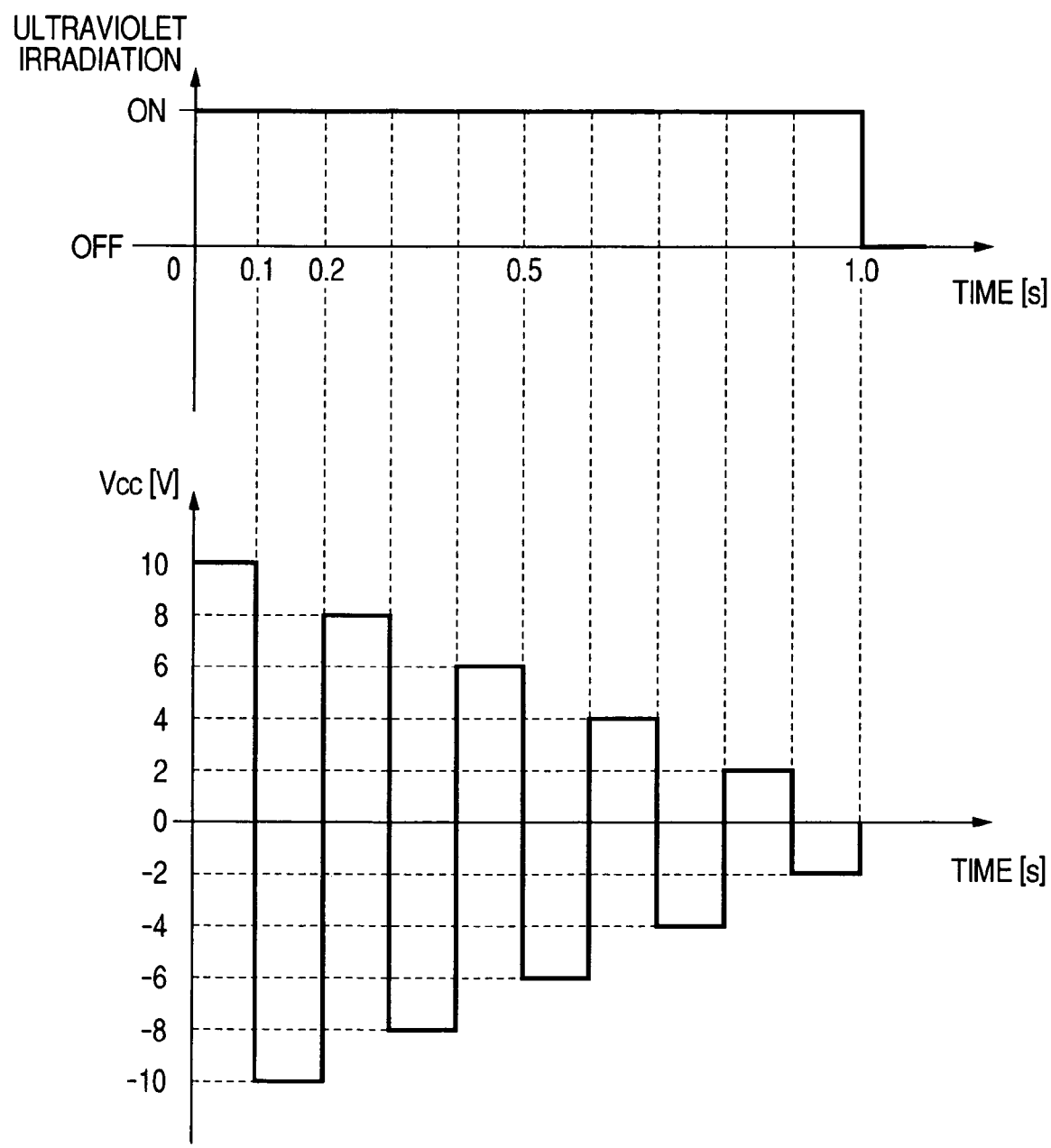
FIG. 12 shows a timing chart for ultraviolet irradiation and control of charge control potential to attain a uniform charge.
Figure 16:
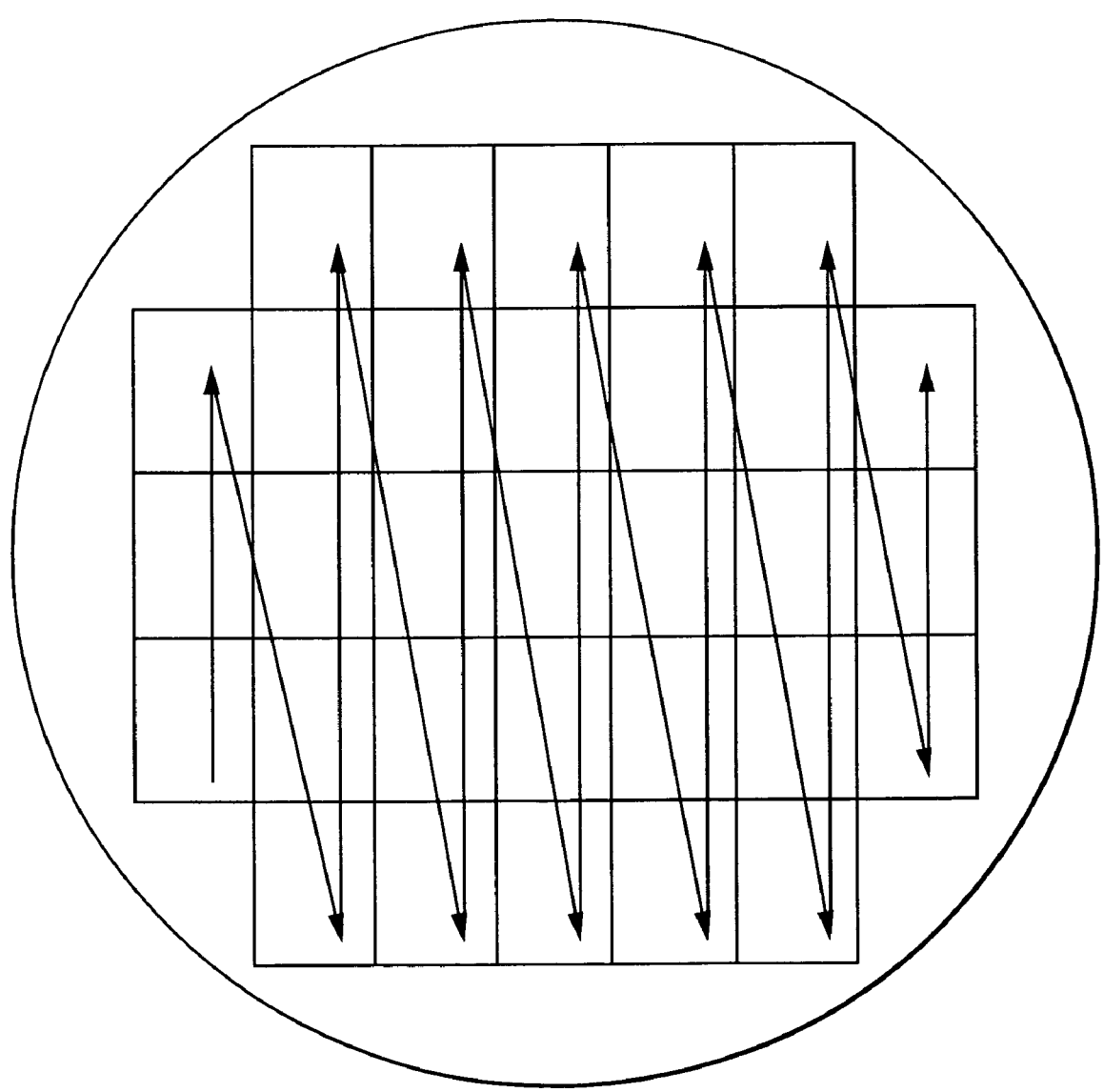
FIG. 16 illustrates an example of ultraviolet irradiation.

As explained above, the charge of a wafer can be controlled by irradiating ultraviolet light onto the wafer and either by drawing up or pulling down the photoelectrons emitted from the wafer. Further, the charge potential of the wafer can be controlled by controlling the voltage to be applied to the charge control electrode. For example, as shown in FIG. 12, for getting the charge potential of a wafer to be 0V, it is possible to attain it by, while irradiating ultraviolet onto the wafer, controlling the potential of the charge control electrode to be 10, −10, 8, −8, 6, −6, 4, −4, 2, −2, and 0V. By this means, it is possible to get the 0V charge potential regardless of the wafer's previous charge, positive or negative. The charge potential of the wafer can be controlled to be not only 0V but also to be any desired potential level. Further, it is possible to get a uniform charge all over the surface of a wafer by having ultraviolet irradiation scan the wafer as shown in FIG. 16, while keeping a constant potential at the charge control electrode.

Embodiment 1

Figure 1:
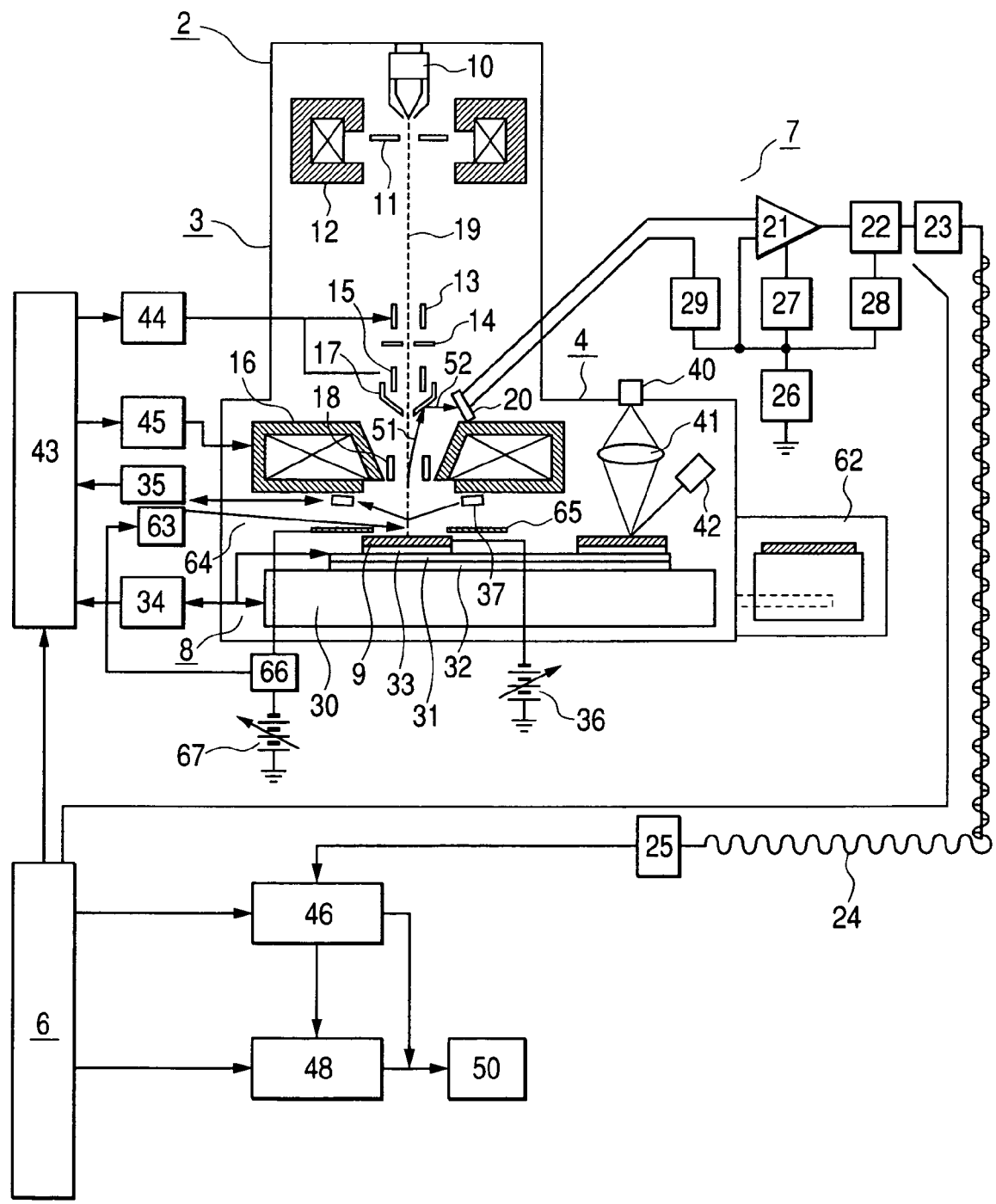
FIG. 1 is a schematic diagram showing the system configuration of IX.

FIG. 1 shows the configuration of an inspection apparatus relating to the first embodiment of the present invention. The inspection apparatus comprises an inspection chamber 2 inside of which can be evacuated, and a spare chamber (not described in the figure of this embodiment) that is used to transfer a sample substrate 9 into the inspection chamber 2 and configured so as to be evacuated independently of the inspection chamber 2. The inspection apparatus, in addition to the inspection chamber 2 and the spare chamber referred to above, further comprises a control unit 6, and an image processing unit. Inside of the inspection chamber mainly comprises an electro optical system 3, a detection unit, a sample chamber 8, an optical microscope unit 4 and an ultraviolet irradiation system.

The ultraviolet irradiation system comprises a ultraviolet light source 63 and a ultraviolet light source control device not shown in the figure, and the ultraviolet light source control device is capable of potential control of the ultraviolet light source and the charge control electrode 65. As the ultraviolet light source, a light source with the wavelength of 126 nm and 20 W power may be used.

The electro optical system 3 comprises an electron gun 10, an electron beam inducing electrode 11, a condenser lens 12, a blanking deflector 13, a scanning deflector 15, a diaphragm 14, an objective lens 16, a reflector plate 17 and E×B deflector 18. A detector 20 of the detection unit 7 is arranged above the objective lens 16 in the inspection chamber 2. The output signals from the detector 20 are amplified by a pre amp 21 outside the inspection chamber 2, and transformed to digital data by an A/D converter 22. The sample chamber 8 comprises a sample stage 30, an X stage 31, a Y stage 32, a rotary stage 33, a position monitoring length measurement device 34, and a sample substrate height measurement device 35.

The optical microscope unit 4 is provided in the neighborhood of the electro optical system 3 but apart enough not to affect each other, and the distance between the electro optical system 3 and the optical microscope unit 4 is known. And the X stage 31 and the Y stage 32 are movable to and from the known distance between the electro optical system 3 and the optical microscope unit 4. The optical microscope unit 4 comprises a light source 40, an optical lens 41 and a CCD camera 42. The image processing unit comprises an image storing unit 46 and a computer 48. Captured electron beam images or optical images will be displayed on a monitor 50.

Operational directions and operational parameters for each part of the apparatus are input or output from the control unit 6. The control unit 6 is input beforehand with the parameters such as acceleration voltage for electron beam generation, width of electron beam deflection, deflection speed, timing of signal acquisition by the detecting system, speed of sample stage movement, etc. so that they can be optionally or selectively set according to the objective. The control unit 6, by means of an adjustment control circuit 43, monitors deviations or differences of the position and/or height by the signals from the position monitoring length measurement device 34 and the sample substrate height measurement device 35, generates adjustment signals based on the monitoring results and send the adjustment signals to a power source of the object lens 45 and a scan deflector 44 so that an electron beam always may be directed to the correct location. To acquire an image of the sample substrate 9, an electron beam 19 is narrowed to irradiate the sample substrate 9 and generate secondary electrons and backscattering electrons 51, that are detected in synchronization with the scanning of the electron beam 19 and the movement of stages 31, 32, which enables the acquisition of images of the sample substrate 9 surface.

For the electron gun 10, a heat electric field emission electron source of diffusion-refill type is used. By using this electron gun 10, more stable electron beam current can be secured and this potential contrast images with less brightness fluctuation can be obtained than by using conventional guns, e.g. a tungsten (W) filament electron source or cooled electric field emission type electron source. The electron beam 19 is induced from the electron gun 10 by applying a voltage between the electron gun 10 and the electron beam inducing electrode 11. Application of a high voltage negative potential on to the electron gun 10 performs the acceleration of the electron beam 19.

Now, the electron beam 19 goes forward toward the sample stage 30 with energy corresponding to its potential, is converged through the condenser lens 12, and further is narrowed through the object lens 16 to irradiate the sample substrate 9 (a substrate with a minute circuit pattern such as a semiconductor wafer, chip, liquid crystal or mask, etc.). In addition, the blanking deflector 13 is connected to a signal generator 44 that generates scanning signals and blanking signals, and the condenser lens 12 and the object lens 16 are respectively connected to a lens electrical source 45. The sample substrate 9 can be charged with a negative voltage (retarding voltage) by a high voltage power source 36. By controlling the voltage of this high voltage power source 36, a primary electron beam can be decelerated, and the energy of electron beam irradiation onto the sample substrate 9 can be adjusted to an optimal value without altering the potential of the electron gun 10.

The negative voltage applied to the substrate 9 accelerates the secondary electrons and backscattering electrons 51 generated by the irradiation of an electron beam 19 onto the sample substrate 9. Above the sample substrate 9 is set the E×B deflector 18, which accelerates the secondary electrons and backscattering electrons 51 and deflects them to a predetermined direction. The amount of deflection can be adjusted by means of the magnitude of the voltage and magnetic field applied to the E×B deflector 18. In addition, this electric field can be varied in coordination with the negative voltage applied to a sample. The secondary electrons and backscattering electrons 51 deflected by the E×B deflector 18 will hit the reflector plate 17 under a prescribed condition. When the accelerated secondary electrons and backscattering electrons 51 hit the reflector plate 17, second secondary electrons and backscattering electrons 52 are emitted from the reflector plate 17.

The detection unit 7 comprises the detector 20 in the evacuated inspection chamber 2, the pre amp 21 outside the inspection chamber 2, the AD converter 22, an optical converting means 23, an transmission means 24, an electrical converting means 25, a high voltage power source 26, a pre amp driving power source 27, an AD converter driving power source 28, and a reverse bias power source 29. As described previously, the detector 20 of the detection unit 7 is set above the object lens 16 in the inspection chamber 2. The detector 20, the pre amp 21, the AD converter 22, the optical converter 23, the pre amp driving power source 27, and the AD converter driving power source 28 are floating at a positive potential by means of the high voltage power source 26. The second secondary electrons and backscattering electrons 52 emitted from the collision with the reflector plate 17 described above are directed to the detector 10 by this attracting electrical field. The detector 20 is configured to detect, in conjunction with the timing of the electron beam 19's scanning, the second secondary electrons and backscattering electrons 52 generated by the collision to the reflector plate 17 of the secondary electrons and backscattering electrons 51 that have been generated during the electron beam 19's irradiation of the sample substrate 9 and then have been accelerated. The output signals from the detector 20 will be amplified by the pre amp 21 located outside the inspection chamber 2 and will be converted to digital data by the AD converter 22.

The AD converter 22 is configured to convert the analog signals detected by the detector 20 to digital signals immediately after they are amplified by the pre amp 21, and then to transmit them to an image-processing unit 5. Since the detected analog signals are digitalized and transmitted immediately after their detection, signals of high speed and high SN ratio can be obtained. As for the detector 20, a solid-state detector, for example, may be used.

The sample substrate 9 is loaded on the X-Y stage 31, 32, and for performing an inspection, either may be selected between having the electron beam 19 scan two-dimensionally while the X-Y stage 31, 32 remains stationary or having the electron beam scan straight in the X direction while the X-Y stage 31, 32 moves in Y direction at a constant speed. It would be effective to take the former method of performing an inspection with the stationary stages for inspecting a relatively small area, and to take the latter method of performing an inspection with the stage moving at a constant speed for an inspection of a relatively broad area. Additionally, when the electron beam 19 needs to be blanking, the electron beam 19 may be controlled to be deflected by the blanking deflector 13, and not to pass through the aperture diaphragm 14.

As the position monitoring length measurement device 34, a length-measuring device using laser interferometry was used in this embodiment. The position of the X stage 31 and the Y stage 32 can be monitored in real time and the information is to be transferred to the control unit 6. Further, the data of the number of rotation, etc. of the motors of X stage 31, the Y stage 32, and the rotary stage 33 are also configured to be sent to the control unit 6 from each driver, Based on such data the control unit 6 is able to grasp precisely the area or location being irradiated by the electron beam 19, and any deviation in the irradiated location can be corrected in real time by the adjustment control circuit 43. In addition, for each sample substrate, the area the electron beam has irradiated is memorized.

As the optical height measurement device 35, an optical measurement device other than an electron beam measuring system, such as a laser interferometer or a reflection optical measuring device which measures a change by the location of a reflection, is used and it is configured so that the height of the sample substrate 9 mounted on the X-Y stage 31, 32 can be measured in real time. The method used in this embodiment comprises; passing a long and thin white light through a slit and directing it to the sample substrate 9 through a transparent window, detecting the location of the reflection by a location detecting monitor, and calculating the change value in the height from the change in the location. The system is configured so that, based on the measured data by this optical height measurement device 35, the focal length of the object lens 16 to narrow the electron beam 19 can be dynamically adjusted, and the electron beam may be irradiated keeping focus on the inspection area. Further, it is also possible to configure the system so that, measuring the amount of warpage or height distortion of the sample substrate 9 before the electron beam irradiation, based on the data, the adjustment parameters of the object lens may be set for each area of inspection.

The image-processing unit 5 comprises the image memorizing unit 46, the computer 48 and the monitor 50. The image signals for the sample substrate 9 detected by the detector 20 are amplified by the pre amp 21, digitalized by the AD converter 22, converted into light signals by the light converter 23, transmitted through an optical fiber 24, once again converted into electrical signals by the electrical converter 25, and then stored in the image memorizing unit 46.

The electron beam irradiation parameters for image forming and the various detecting parameters for the detection system are previously set at the time of inspection parameter setting, and are registered as a file in a database.

Figure 19:
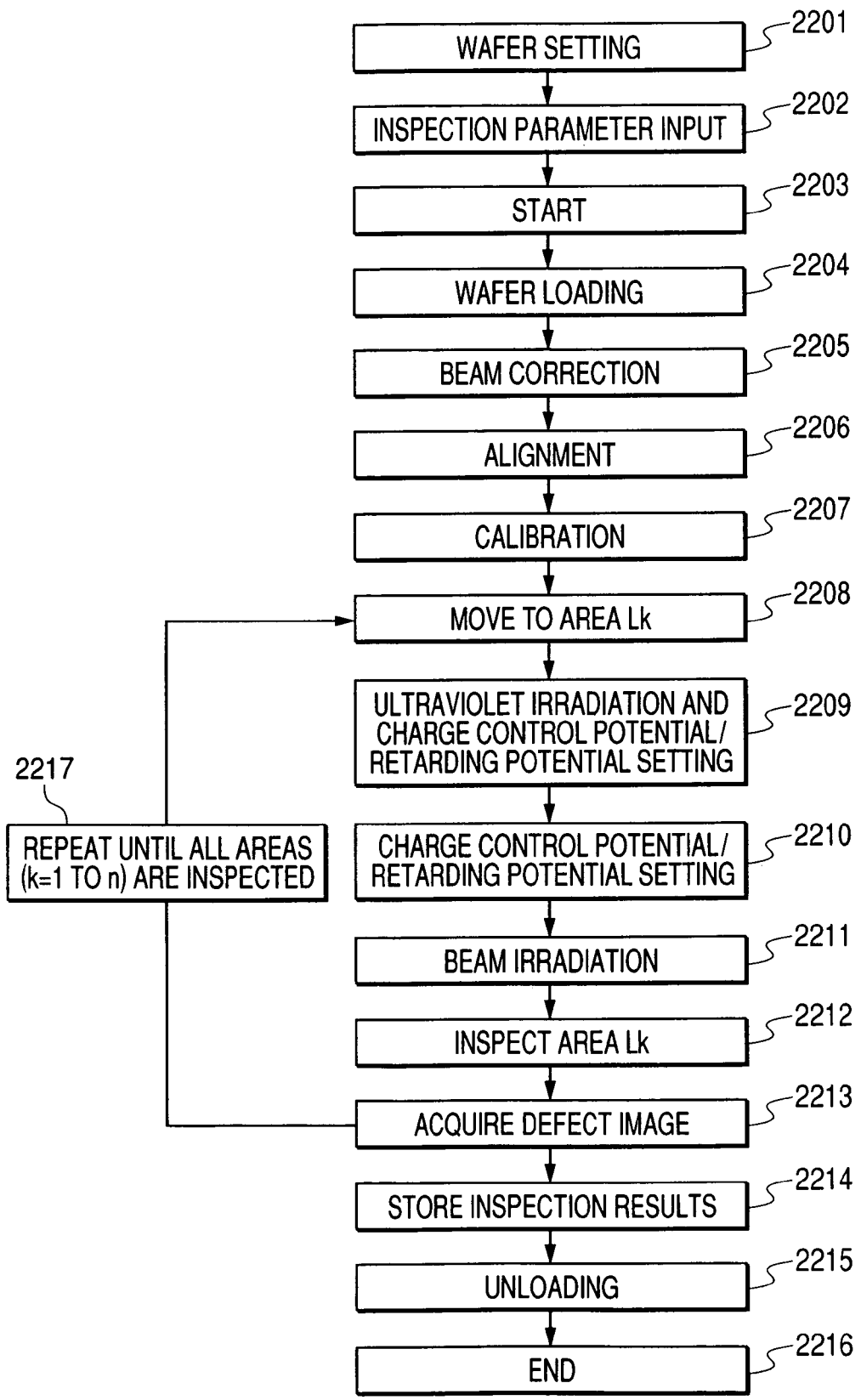
FIG. 19 illustrates an example of an inspection method in accordance with the present invention (the case of a SEM type appearance inspection apparatus).

Next, with reference to the flowchart described in FIG. 19, the steps of inspection to be conducted using the inspection apparatus shown in FIG. 1 will be explained below.

First, at step 2201, a wafer cassette with wafers randomly in its rack is placed. On the operation screen 50, to designate the wafer to be inspected, the number of the rack in the cassette where the wafer is placed is specified. Then at step 2202, various inspections parameters are input through input means including the monitor 50. The items of inspection parameters to be input are electron beam current, electron beam irradiation energy, size of the field of view (FOV, Field of View) in a picture plane, and retarding voltage, etc. The parameters could be input respectively, but usually, sets of parameters for various inspections as mentioned above are compiled as inspection parameter files in a database, out of which the inspection files according to the scope of inspection can be selected and input.

At step 2203, an automatic inspection gets started upon the system operator's input of the inspection parameters into the input means. First, the designated wafer 9 is loaded into the inspection apparatus (step 2204). The wafer handling system is designed to accommodate the cases where the sample wafer 9 has a different diameter or a different shape, orientation-flat type or notch type, etc., by changing the holder to place the wafer 9 in accordance with the size and shape of the wafer. The sample wafer 9 is placed on the holder from the wafer cassette by means of a wafer-loader comprising an arm and a preliminary evacuation chamber, gets evacuated in the wafer-loader as it is hold and fixed on the holder, and then transported to the inspection chamber 2 which is already made vacuum by an evacuation system.

After wafer loading, at step 2205, according to the inspection parameters input as mentioned above, the control unit 6 sets the electron beam irradiation parameters for each relevant unit. Then, the stage 32 moves so that the first beam correction pattern on the wafer-holder comes under the electro-optical system, the voltage contrast image of the beam correction pattern is obtained, and, based on the voltage contrast image, the focus and astigmatism are adjusted. Then moving to the predetermined portion of the sample wafer 9, a voltage contrast image of the wafer 9 is acquired to adjust the contrast, etc. At this point, if alteration of the electron beam irradiation parameters, etc. is necessary, the beam correction may be performed again. At the same time, the height of the wafer 9 is measured by a height sensor 37, and the wafer height detection system 35 calculates the correlation between the height information and focusing parameters of the electron beam, so that, when later acquiring a voltage contrast image, the focusing parameters be automatically adjusted based on the result of wafer height measurement without performing the focus adjustment each time.

At step 2206, the wafer 9 set on the holder is moved by the XY stage 32, 33 for the optical microscope unit 4 to observe the first coordinate for alignment. The optical microscopic image of the alignment pattern formed on the wafer 9 is observed on the monitor 50, compared with the same pattern image previously memorized, and the position adjustment value for the first coordinate is calculated. Then, moving to the second coordinate which is apart a certain distance from the first coordinate and having a circuit pattern equivalent with the one at the first coordinate, the optical microscopic image is likewise observed and compared with the circuit pattern image previously memorized for alignment, and the position adjustment value for the second coordinate and the amount of rotary deviation from the first coordinate are calculated.

After finishing the preparatory work, such as the prescribed adjustments and definition of inspection area, etc. under the optical microscope unit 4 as described above, the XY stages 32, 33 move to bring the wafer 9 under the electronic optical system 3. When the wafer 9 comes under the electronic optical system 3, the same alignment operation as conducted under the optical microscope unit 4 mentioned above is undertaken with voltage contrast images. A voltage contrast image for this operation is acquired by the following method: based on the coordinate values memorized and adjusted through the above mentioned position alignment process using the optical microscopic images, the same circuit pattern that was observed by the optical microscope 4 is irradiated by the electron beam 19 scanning two dimensionally in XY directions by means of the scanning deflector 15. This two-dimensional scan of the electron beam causes the portion of observation to emit the secondary electrons 51, which are detected by the configuration and operation arranged for the detection of such emitted electrons, and a voltage contrast image is acquired. Since preliminary position identification, position alignment, and position adjustment including rotary adjustment are already conducted with the optical microscope images, with the voltage contrast images, position alignment, position adjustment and rotary adjustment can be conducted in higher resolution, higher magnification and higher precision than with optical images. Additionally, when an electron beam 19 is irradiated onto the wafer 9, the irradiated portion gets charged. In order to avoid the charge's affection to the inspection, for the circuit pattern to be irradiated by the electron beam 19 for the preparatory work before inspection, such as the rotary position adjustment and the definition of inspection area, etc., a circuit pattern outside the inspection area is selected, or alternatively, an equivalent circuit pattern from a chip other than the sample chip is prepared for the automatic selection through the control unit 6.

The results of the alignment conducted in this manner are transferred to each control unit, which adjust the rotation and position coordinates for an inspection.

Completing the alignment, we move to the second correction pattern loaded on the sample holder. The second correction pattern is used to make signal strength match the signal of the voltage contrast image obtained through the inspection. The pattern is fabricated to have sufficiently low resistance via holes and sufficiently high resistance via holes. Using the voltage contrast image of this pattern, signal value for the portion of sufficiently low resistance and the portion of sufficiently high resistance are corrected. As for a portion of sufficiently low resistance, an insulated portion without a pattern may be used. Based on the results, we move onto the wafer 9, acquire a voltage contrast image of the patterned portion on the wafer, and perform calibration (step 2207).

Figure 18:
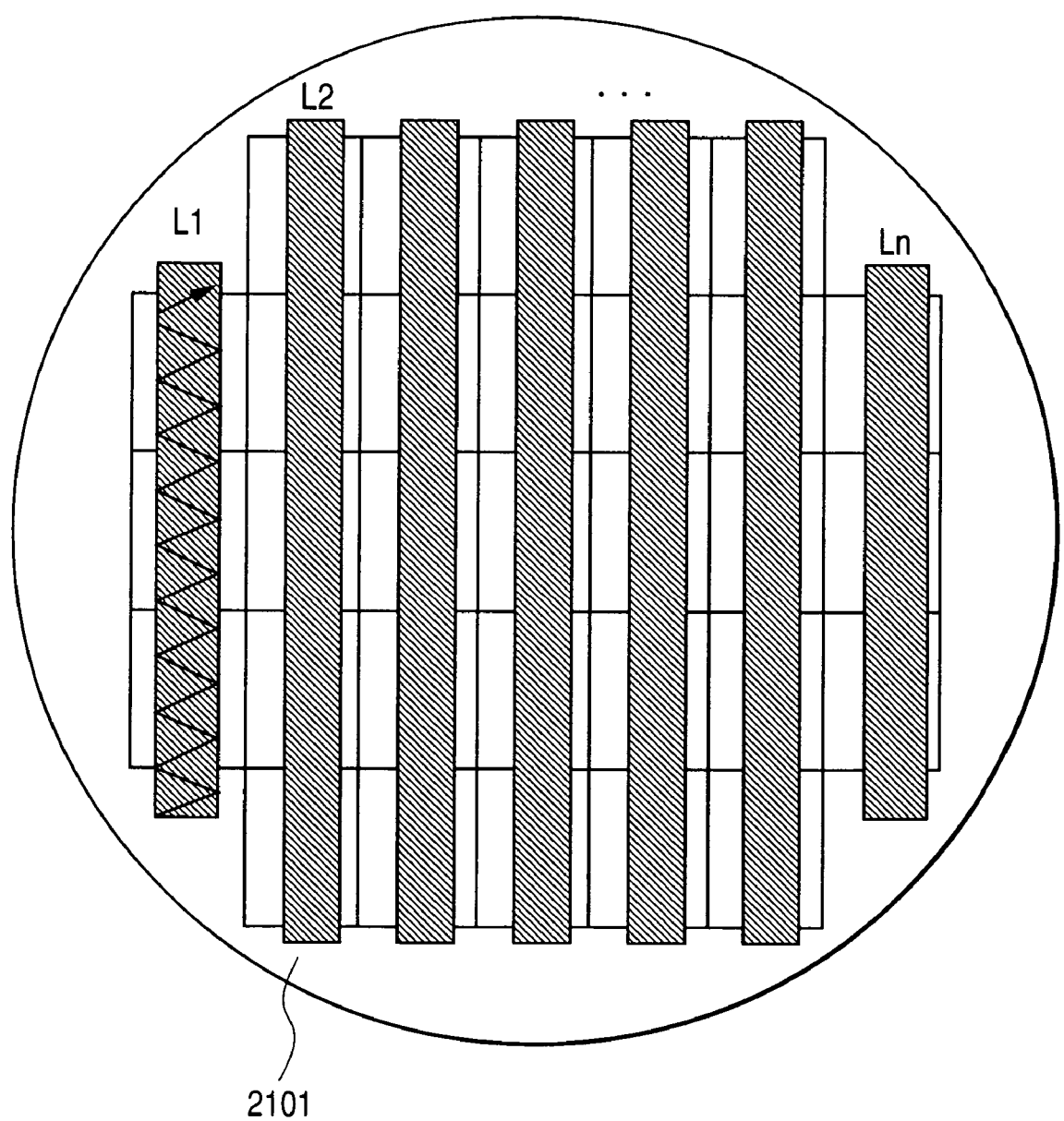
FIG. 18 illustrates an example of inspection areas.

Finishing calibration, at step 2208, we move onto the inspection area Lk. Then, at step 2209, irradiate ultraviolet to remove any charge on the wafer accumulated through its fabrication process (hereinafter, "residual charge"). As charge resulting from the fabrication process, e.g. charge through plasma etching can be considered. In plasma etching, ions or electrons are irradiated onto the wafer and its surface is processed by the chemical and physical reactions with silicon. When the wafer is processed, it is exposed to charged particles such as ions or electrons and gets electrically impaired, and charges remain even after the processes. At step 2209, in parallel with the ultraviolet irradiation, an electrical source control unit 66 controls charge control potential so as for the charge of the wafer to be uniform. In particular, as shown in FIG. 12, charge control potential Vcc is controlled by the electrical source control unit 66 for its absolute value to descend over time. At this point, we may move to the next step either after removing residual charge from the whole surface of the wafer as shown in FIG. 16 or after removing residual charge from the inspection area as shown in FIG. 18. In addition, the removal of residual charge from the whole surface of the wafer may be performed just after wafer loading (Step 2204).

Although it had been a conventional problem that residual charges generate shading, degrading inspection accuracy or sensitivity of defect detection, the problem was resolved by removing residual charges before inspection. By the technology described in this embodiment, it became possible to remove a residual potential not only of negative polarity but also of positive polarity.

Then, at step 2210, in accordance with the parameters previously input in the control system 6, the electron irradiation parameters, the charge control potential and retarding potential are set, an electron beam is irradiated at step 2211, and an inspection is performed at step 2212. A voltage contrast image obtained at this stage should be with no shading because charges have been removed by ultraviolet irradiation. At step 2213, the defect image detected at step 2212 is stored.

Above explained inspection operation is repeated in the following routine as shown in step 2217: move to the area Lk (step 2208)→ultraviolet irradiation and setting charge control potential and retarding potential for a uniform charge (step 2209)→setting of charge control potential and retarding potential for image acquisition (step 2210)→beam irradiation (step 2211)→inspection of area Lk (step 2212) →acquisition of a defect image (step 2213).

When moving to the next inspection area, either methods may be selected; the method of moving the scan area of the electron beam 19 without moving XY stages 31, 32, or the method of moving XY stages 31, 32. In the case of inspecting a particular relatively small area, the former inspection method with the stable stages, and in the case of inspecting a relatively broader area, the latter inspection method of moving the stages would be effective. Incidentally, when changing the inspection area, if the electron beam needs to be blanked, the electron beam 19 may be controlled to be deflected by the blanking deflector 13 so as not to irradiate the wafer.

Further, in order to remove the effects of charge on the inspected area, another charge clearance by ultraviolet irradiation may be performed.

Conducting inspections of designated areas in this manner, the wafer is inspected overall or partially, and at step 2214, the inspection results are stored. When the inspection is over, the wafer is unloaded at step 2215, and it comes to the end at step 2216.

By the inspection method above described, it becomes possible to remove the residual of wafer's charge before inspection, which has been a conventional problem, and get rid of shading caused by such residual charge. As the results, improved inspection accuracy and defect detection sensitivity have been attained.

Embodiment 2

In accordance with this embodiment of the present invention, a defect inspection is conducted using the inspection apparatus described in the first embodiment, acquiring a voltage contrast image of a wafer that has been charged to a desired voltage.

In particular, just before the acquisition of an inspection image, a voltage was applied to the charge control electrode to produce a potential barrier to the electrons as high as −5V, and while irradiating ultraviolet, the stage was scanned so as for the wafer to be irradiated with ultraviolet all over the surface. The wafer's charge potential was made almost the same as that of the charge control electrode, and with the ultraviolet irradiation all over the wafer, a uniform charge of −5V across the wafer was attained.

Figure 4:
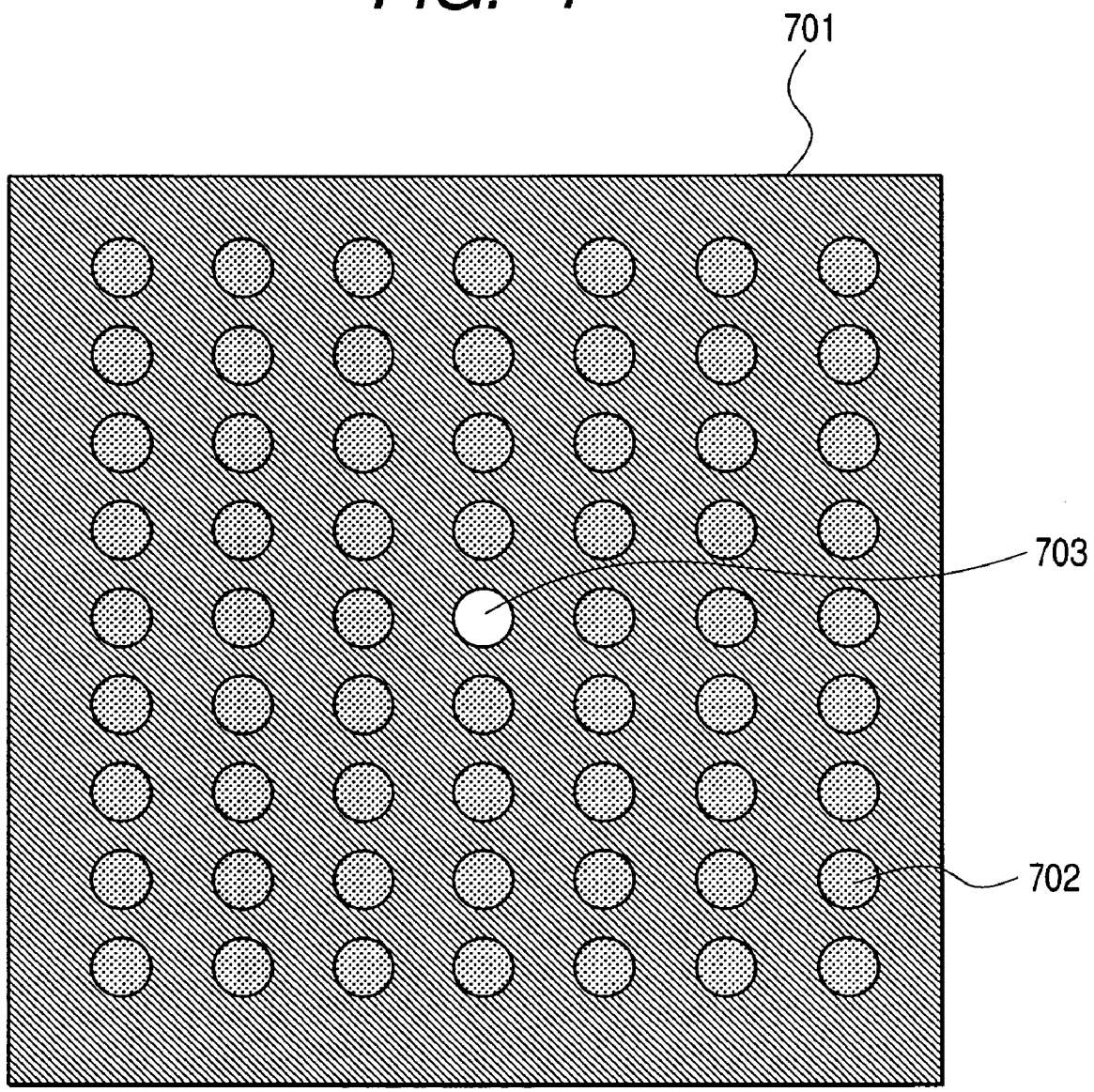
FIG. 4 is a positive voltage contrast image.
Figure 5:
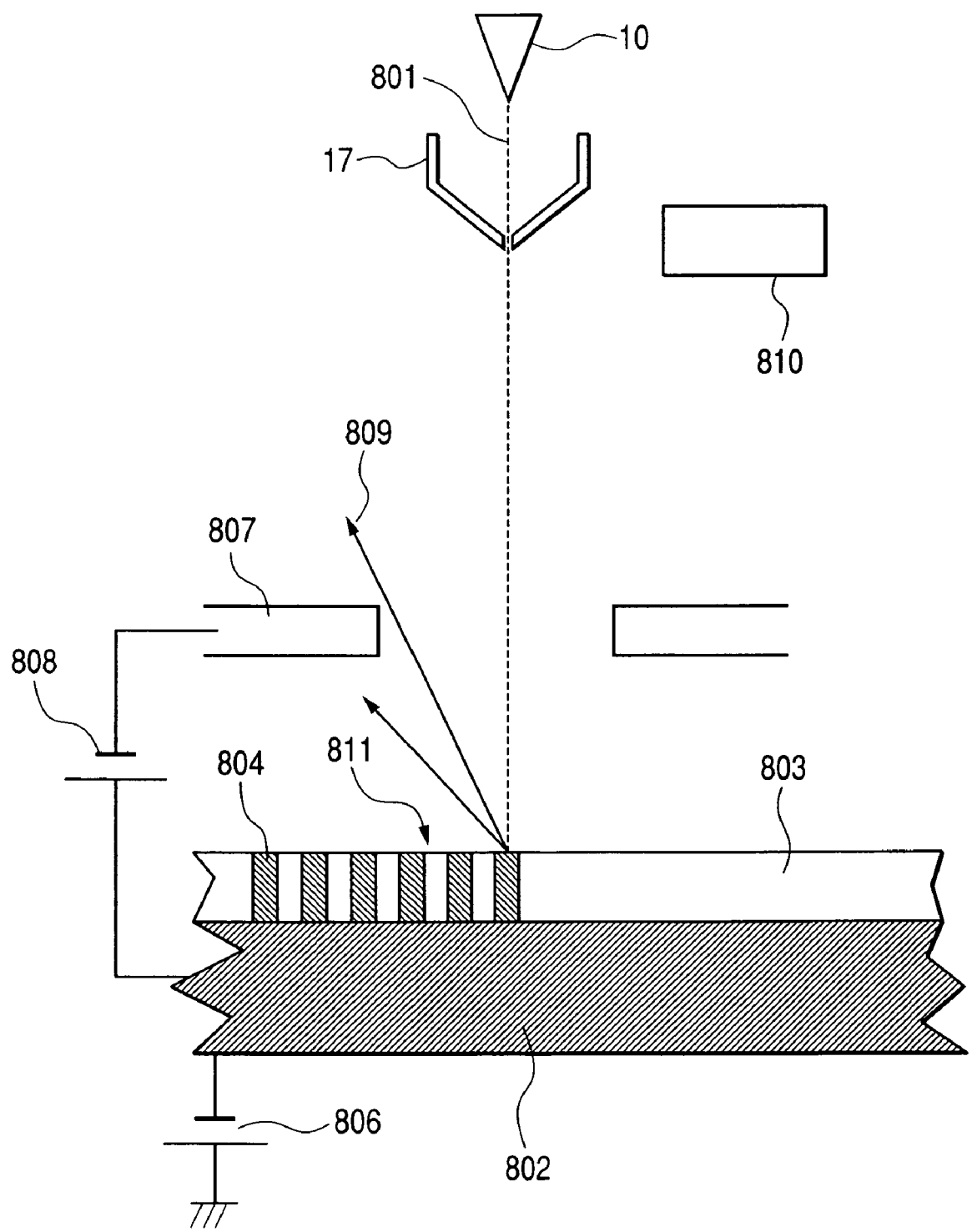
FIG. 5 illustrates the principle of shading generation.

Then, with the potential of the charge control electrode being set at 1000V relative to the wafer (FIG. 19, step 2210), an inspection is started. The secondary electrons generated by the scan of ultraviolet irradiation are accelerated by the charge control electrode charged to 1000V and are directed to the detector effectively, and a negative voltage contrast image 701 was acquired, as shown in FIG. 4, which is of large signal volume, low noises and no shading and in which plugs 702 and conductivity fault defect 703 are clearly shown. As the results, improved detection sensitivity for conductivity faults and short defects was attained.

Embodiment 3

In accordance with this embodiment, an example of performing a length-measurement of a pattern formed on a wafer using a measuring SEM will be explained.

Figure 2:
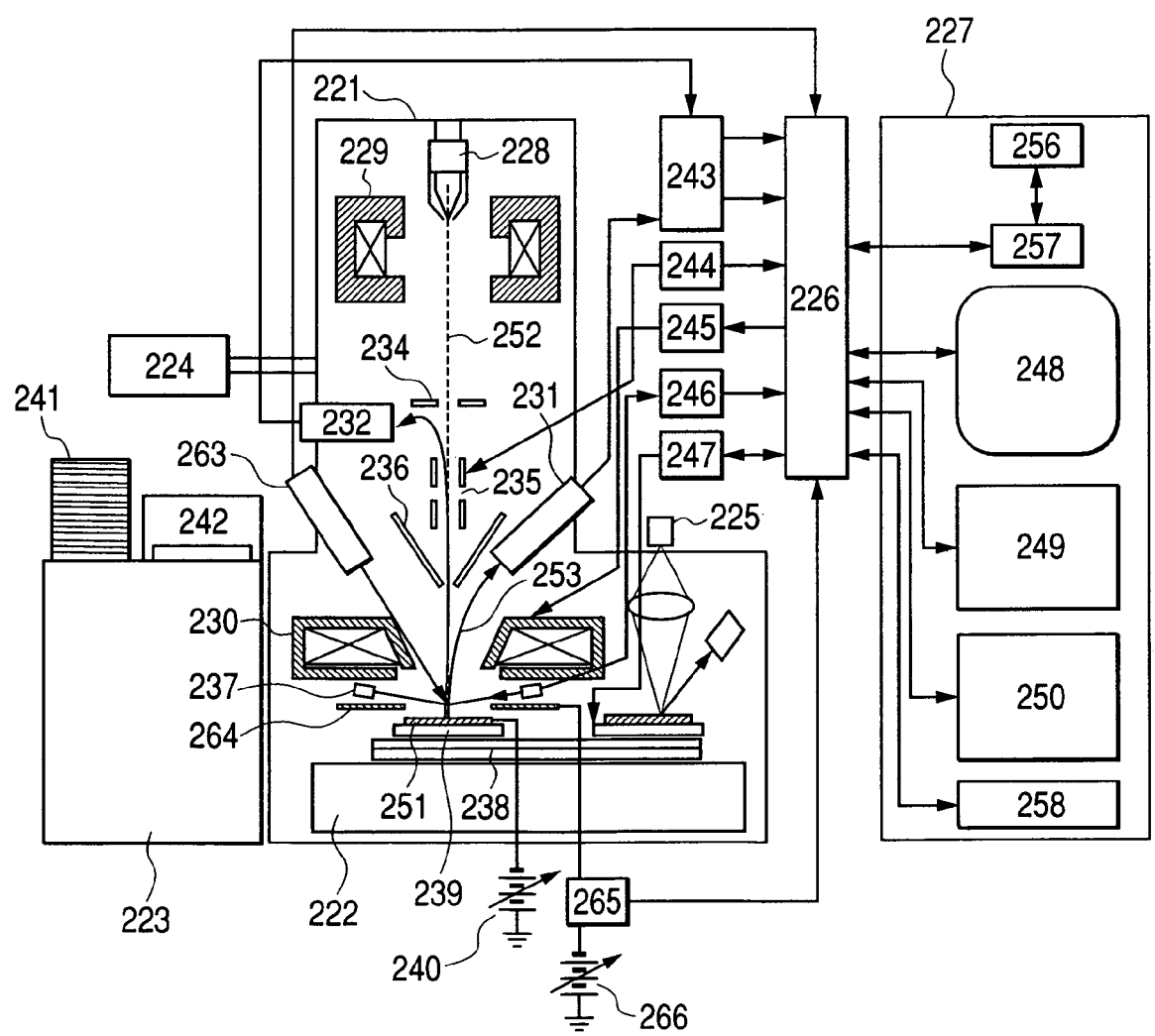
FIG. 2 is a schematic diagram showing the system configuration of a measuring SEM.

In FIG. 2 shown is an example of the configuration of a measuring SEM. This apparatus comprises an electro optical system 221, a stage mechanism system 222, a wafer handling system 223, an evacuation system 224, an optical microscope 225, a control system 226 and an operation unit 227. The electro optical system 221 comprises an electron gun 228, a condenser lens 229, an object lens 230, a secondary electron detector 231, an energy filter 234, a deflector 235, a reflector plate 236, and a wafer height detector 237. The stage mechanism system 222 comprises XY stage 238, a holder 239 for loading a sample wafer and a retarding electric source 240 for applying a negative voltage onto the holder 239 and a wafer 251.

On the XY stage 238, attached is a position detector by laser length measurement. The wafer handling system 223 comprises a cassette loading unit 241 and a loader 242, and the holder 239 loaded with a wafer 251 is to travel back and forth between the loader 242 and the XY stage 238. The control system 226 comprises a signal detection system-controlling unit 243, a beam deflection adjustment controlling unit 244, an electro optical system controlling unit 245, a wafer height sensor detection system 246, and a mechanism/stage controlling unit 247. The operation unit 227 comprises an operation screen and operation unit 248, an image processing unit 249 and an image/length-measurement data-storing unit 250.

Figure 20:
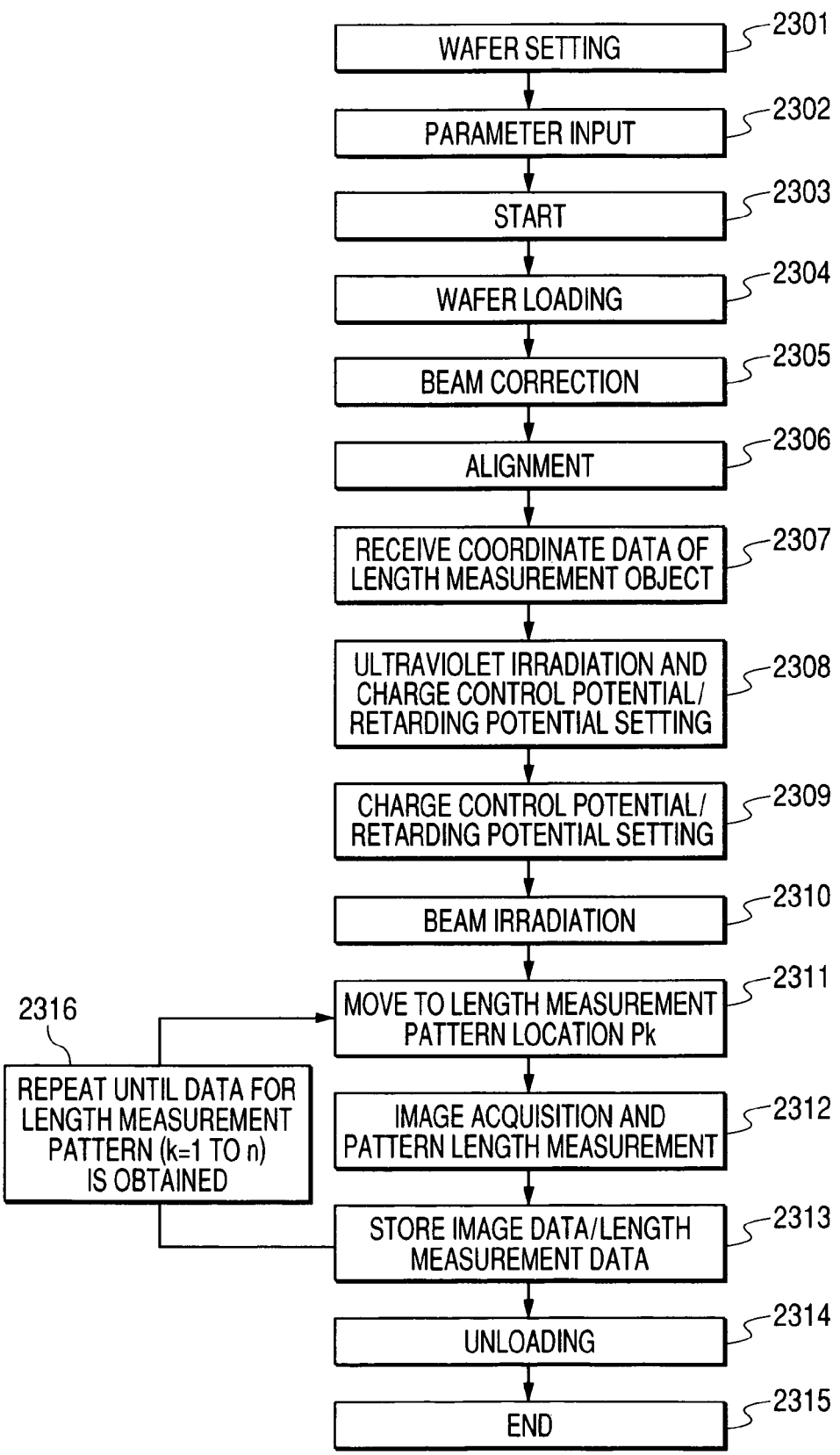
FIG. 20 illustrates an example of an inspection method in accordance with the present invention (the case of a measuring SEM).

Now, with reference to the flowchart described in FIG. 20, the operation of each unit in FIG. 2 will be explained below.

First, at step 2301, a wafer cassette with wafers randomly placed in its racks is placed on the cassette-loading unit 241 of the wafer handling system 223 in FIG. 2.

Next, at step 2302, on the operation screen 248, to designate the wafer 251 to be measured, the number of the rack in the cassette where the wafer is placed is specified.

Further, a configuration file that stores the location data for the pattern to be measured based on its fabrication data is selected on the operation screen 248. For this selection, the configuration file may be taken in through telecommunication like the Internet, etc., or may be read in through a storage media like a floppy disk.

In either case, it may be required that, by designating the name of the configuration file, various data for the pattern to be measured are read into a data input unit 256 and are converted by a data conversion unit 257 into the data in data formats and coordinate systems used in the measuring SEM. Finishing the input of necessary parameters for performing length measurement, at step 2303, upon the input of the parameters by the operator, the sequence of length measurement gets started. At step 2304, the designated wafer is transported into the reviewing apparatus. The wafer handling system 223 is designed to accommodate the cases where the sample wafer has a different diameter or a different shape, orientation-flat type or notch type, etc., by changing the holder 239 to place the wafer 251 on in accordance with the size and shape of the wafer. The sample wafer for length measurement is placed on the holder from the wafer cassette by means of the wafer-loader 242 comprising an arm and a preliminary evacuation chamber, and then transported to the inspection chamber as it is held and fixed on the holder.

After the wafer 251 is loaded at step 2304, at step 2305, according to the length measurement parameters input as mentioned above, the electro optical system controlling unit 245 sets the electron beam irradiation parameters for each relevant unit. Then, an electron beam image of a predetermined area of the wafer is obtained, and based on the image, the focus and astigmatism are adjusted. And, in parallel, the height of the wafer 251 is measured by the height sensor 237, and the correlation between the height information and the focusing parameters of the electron beam is calculated, so that, when later acquiring an electron beam image, the focusing parameters may be automatically adjusted based on the result of the wafer height measurement without performing the focus adjustment each time.

Finishing the adjustment of the electron beam irradiation parameters and the focus-astigmatism adjustment, at step 2306, the alignment is performed using two points on the wafer.

After finishing the alignment, rotation and coordinate values are adjusted based on the results of the alignment, and in accordance with various information from the configuration file read in at step 2307, the pattern for length measurement is identified and located.

At this stage, there can be cases where, as shown in FIG. 22, a potential distribution 2501 of the wafer for length-measurement shows charge variations in the range of tens of volts within the plane. In this case, the charges cause deviated focuses, which, as shown in FIG. 24, brings an image with obscured contours of the pattern for length-measurement 2701, with the problem of degrading the accuracy of the length-measurement data 2702.

Therefore, it is required to have a uniform charge all over the wafer before conducting measurement. To get a uniform charge, at step 2308, while ultraviolet is irradiated, charge control potential and retarding potential are controlled. As shown in FIG. 12, by controlling the charge control potential so as for its absolute value to descend over time during the ultraviolet irradiation, a uniform charge distribution 2502 all over the wafer was obtained as shown in FIG. 22. As for the charge control voltage to be applied to the wafer, not only the pulse-shaped voltage signal as shown in FIG. 12, but also alternating potential signal may be applied with changed polarity. In this case, an AC power is to be connected to the charge control electrode.

Figure 15:
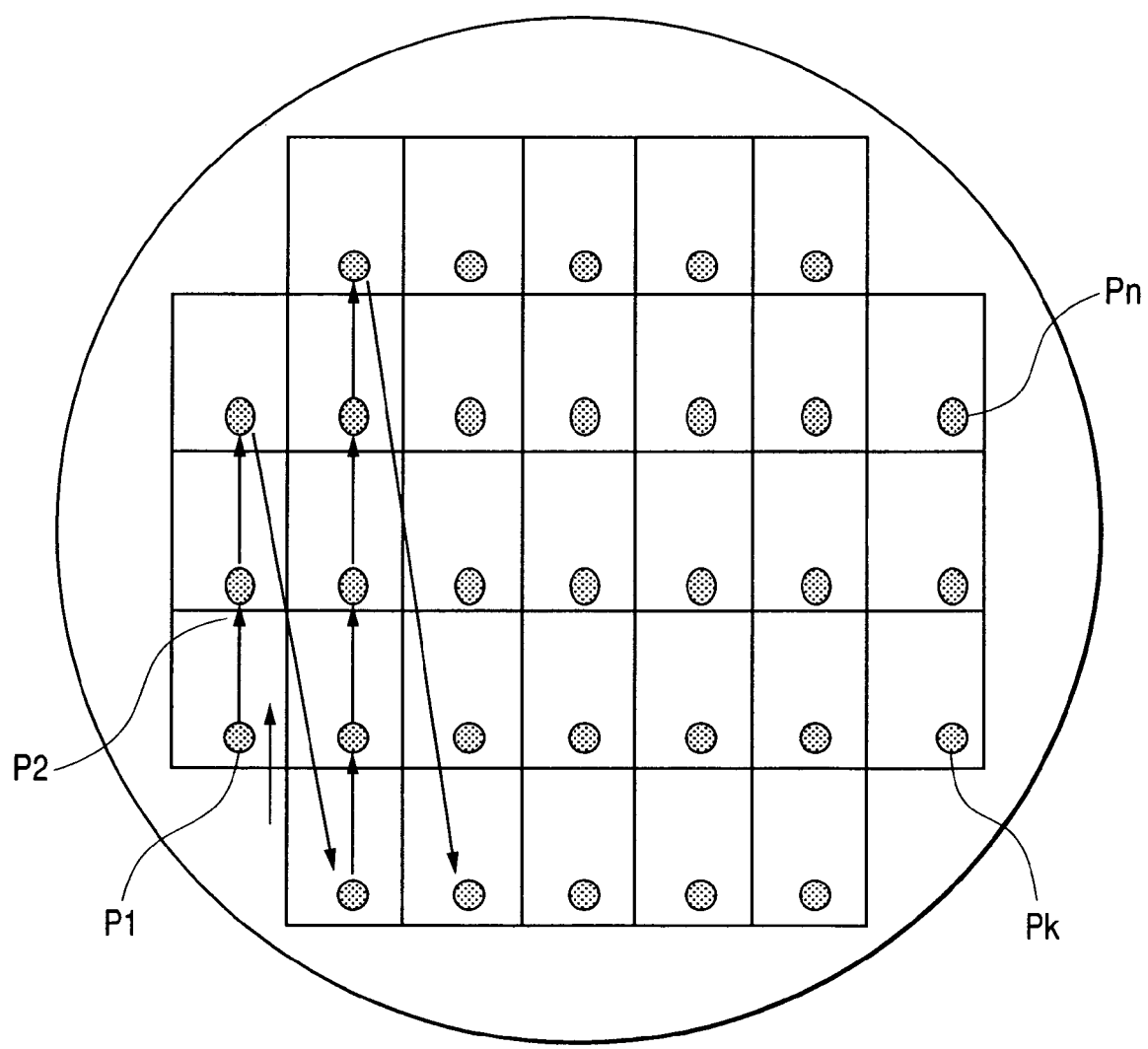
FIG. 15 illustrates an example of ultraviolet irradiation and charge control.
Figure 17:
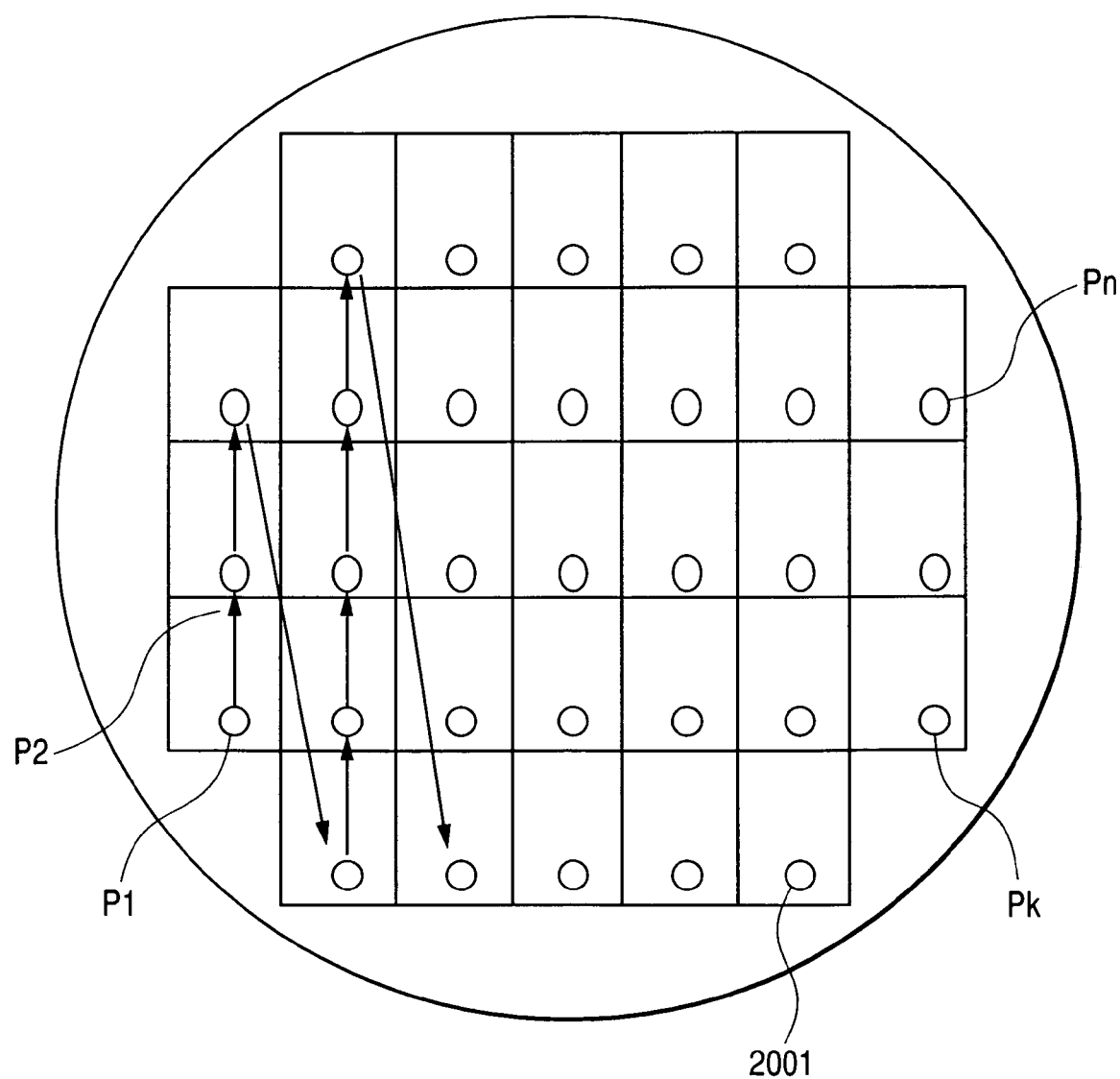
FIG. 17 illustrates an example of charge control and observation.

After having a uniform charge, at step 2309, as shown in FIG. 10, setting the charge control potential to be positive relative to the wafer, irradiating a beam at step 2310, moving to the pattern for length measurement at step 2311, and at step 2312, the image of the pattern for length measurement and measured data are acquired. Since the wafer has a uniform charge, the contours of the pattern for length measurement 2703 are clear, and measured data 2704 were acquired in high accuracy. Incidentally, in this embodiment, after ultraviolet irradiation and making the charge uniform all over the wafer as shown in FIG. 16, the acquisition of images and data of the pattern for length measurement was performed in the manner as shown in FIG. 17. It is also recommendable, however that, as shown in FIG. 15, ultraviolet irradiation to get an evenly charged pattern for length measurement may be performed each time a defect image is acquired.

At step 2313, the image and length-measurement data acquired are stored in the image/data storing unit 250 if necessary. It is to be set beforehand in the configuration file whether the image and data are to be stored or not.

Above explained operation of image storing and length-measurement data acquisition is repeated in the following routine as shown in step 2316: move to the location of the pattern for length measurement (step 2311)→image acquisition and length measurement of the pattern (step 2312) →storage of the image and length measurement data.

Completing above described series of actions for all the patterns assigned for length measurement on a wafer, at step 2314, the wafer is unloaded, and the length measurement comes to the end at step 2315.

Embodiment 4

In accordance with another embodiment of the invention, an example of classifying defects using a review SEM is explained.

Figure 3:
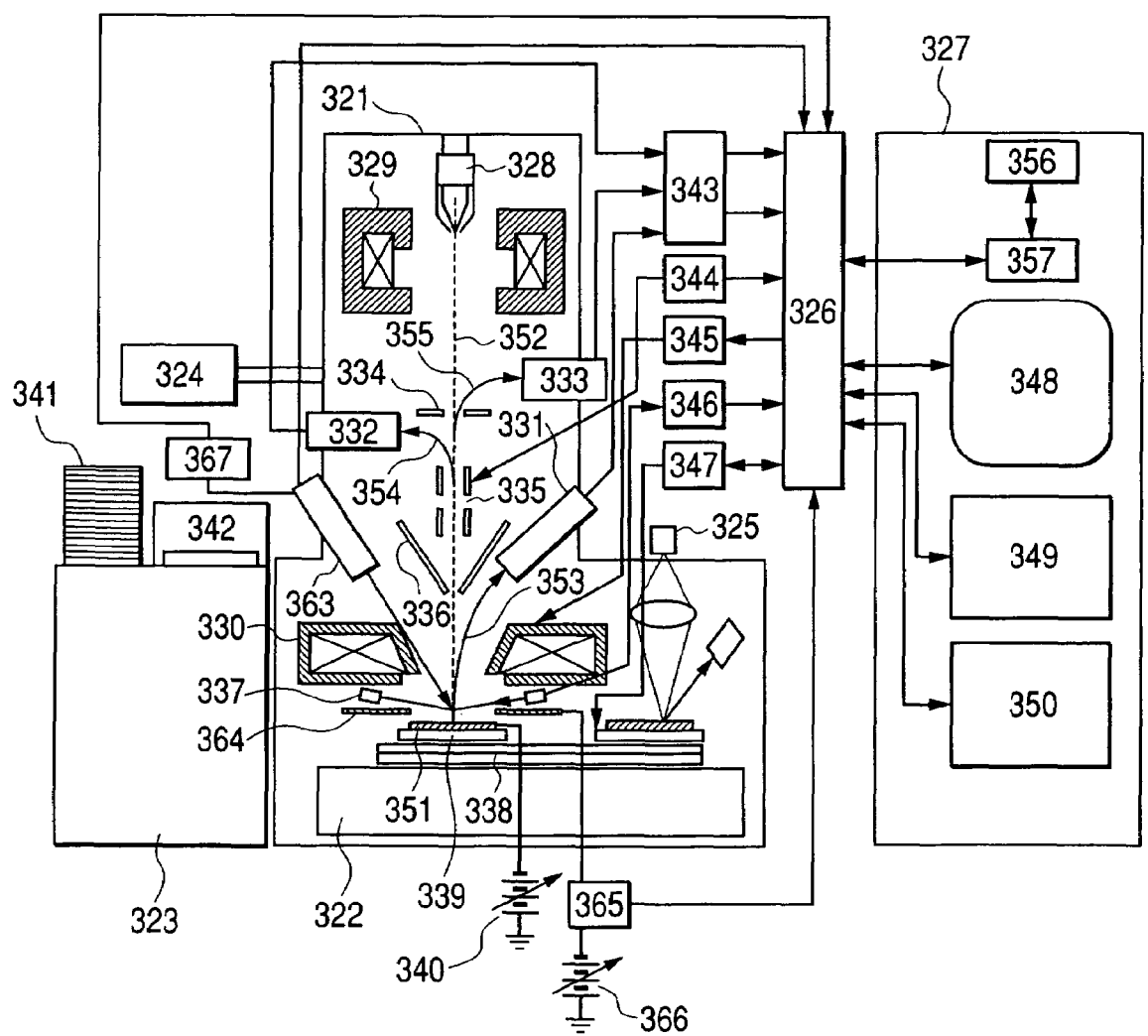
FIG. 3 is a schematic diagram showing the system configuration of a review SEM.

FIG. 3 shows an example of the configuration of a review SEM. This apparatus comprises an electro optical system 321, a stage mechanism system 322, a wafer handling system 323, an evacuation system 324, an optical microscope 325, a control system 326 and an operation unit 327. The electro optical system 321 comprises an electron gun 328, a condenser lens 329, an object lens 330, a first detector 331, a second detector 332, a third detector 333, an energy filter 334, a deflector 335, a reflector plate 336, and a wafer height detector 337. The stage mechanism system 322 comprises an XY stage 338, a holder 339 for loading a sample wafer and a retarding electric source 340 for applying a negative voltage onto the holder 339 and a wafer 351.

On the XY stage 338, attached is a position detector by laser length measurement. The wafer handling system 323 comprises a cassette loading unit 341 and a loader 342, and a holder 339 loaded with a wafer 351 is to travel back and forth between the loader 342 and the XY stage 338. The control system 326 comprises a signal-detection-system controlling unit 343, a beam-deflection-adjustment controlling unit 344, an electro-optical-system controlling unit 345, a wafer-height-sensor detection system 346, and a mechanism/stage controlling unit 347. The operation unit 327 comprises an operation screen and an operation unit 348, an image processing unit 349 and an image/length-measurement data storing unit 350. Further, the review SEM in FIG. 3 comprises an ultraviolet irradiation system to irradiate ultraviolet. The ultraviolet irradiation system comprises an ultraviolet light source 363 and an ultraviolet light source control device 367. For the ultraviolet light source, for example, a light source of 126 nm wavelength and the power of 20 watts may be used. The ultraviolet light source control device 367 controls the voltage to be applied to the ultraviolet light source 363. On the other hand, an electric power control unit 365 controls the voltage to be applied to a charge control electrode 364.

Figure 21:
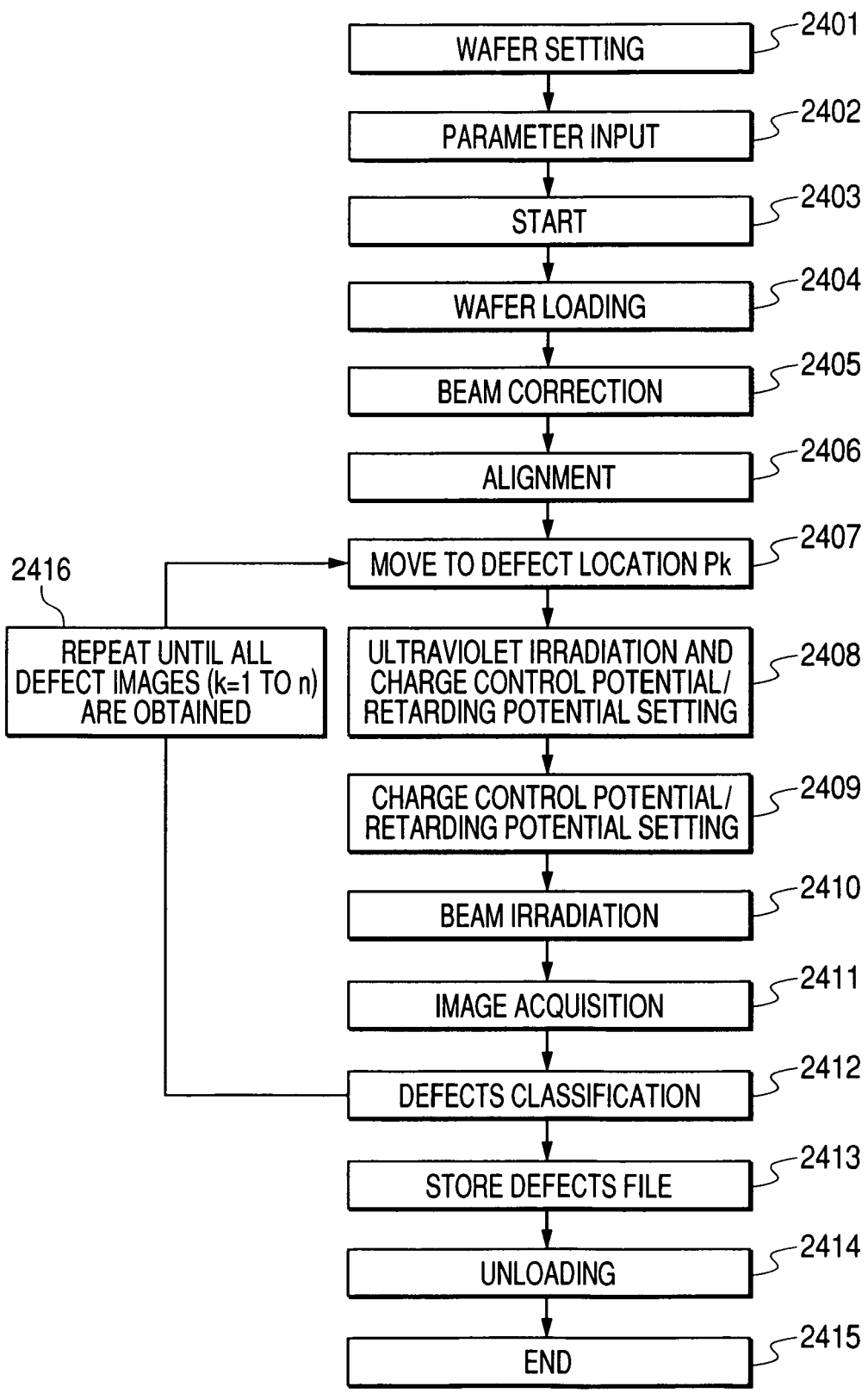
FIG. 21 illustrates an example of an inspection method in accordance with the present invention (the case of a review SEM).

Now, with reference to the flowchart described in FIG. 21, the operation of each unit in FIG. 3 will be explained below.

First, at step 2401, a wafer cassette with wafers randomly placed in its racks is set at the cassette-loading unit 341 of the wafer handling system 323 in FIG. 3.

Next, at step 2402, on the operation screen 348, to designate the wafer 351 to be reviewed, the number of the rack in the cassette where the wafer is placed is specified. Further, in a review operation, in order to observe an electron beam image based on information on inspection results, including location information of defects, etc. already obtained from the inspection by another inspection apparatus, an inspection results file is selected on the operation screen 348. For this selection, the inspection results file may be taken in through telecommunication like the Internet, etc. or may be read in through a storage media like a floppy disk.

In either case, it may be required that, by designating the name of the inspection results file, various data of the inspection results are read into a data input unit 356 and are converted by a data conversion unit 357 into the data in data formats and coordinate system used in the review SEM. Then, on the operation screen 348, the name of a review parameter file is input. This review parameter file comprises combinations of various parameters to determine the contents of review. Finishing the input of necessary parameters for performing a review, at step 2403, upon the input of parameters by the operator, the sequence of automated review gets started.

First, the designated wafer 351 is transported into the reviewing apparatus. The wafer handling system 323 is designed to accommodate the cases of the sample wafers having a different diameter or shape, orientation-flat type or notch type, etc., by changing the holder 339 to place the wafer 351 thereon in accordance with the size and shape of the wafer. The sample wafer is placed on the holder 339 from the wafer cassette by means of the wafer-loader 342 comprising an arm and a preliminary evacuation chamber, and then transported to the inspection chamber as it is held and fixed on the holder.

After the wafer 351 is loaded at step 2404, at step 2405, according to the review parameters input as mentioned above, the electro optical system controlling unit 345 sets the electron beam irradiation parameters for each relevant unit. Then, the electron beam image of the predetermined area of the wafer 351 is obtained, and based on the image, the focus and astigmatism is adjusted. And, in parallel, the height of the wafer 351 is measured by the height sensor 337, and the correlation between the height information and the focusing parameters of the electron beam is calculated, so that, when later acquiring an electron beam image, the focusing parameters may be automatically adjusted based on the result of wafer height measurement without performing the focus adjusting process each time. This embodiment has enabled acquiring continuous electron beam images in high speed.

Finishing the adjustment of the electron beam irradiation parameters and the focus-astigmatism adjustment, at step 2406, the alignment is performed using two points on the wafer.

After finishing the alignment, at step 2407, rotation and coordinate values are adjusted based on the results of the alignment, and in accordance with various information from the inspection results file already read in, the position of the defects to be reviewed is identified and located.

Figure 13:
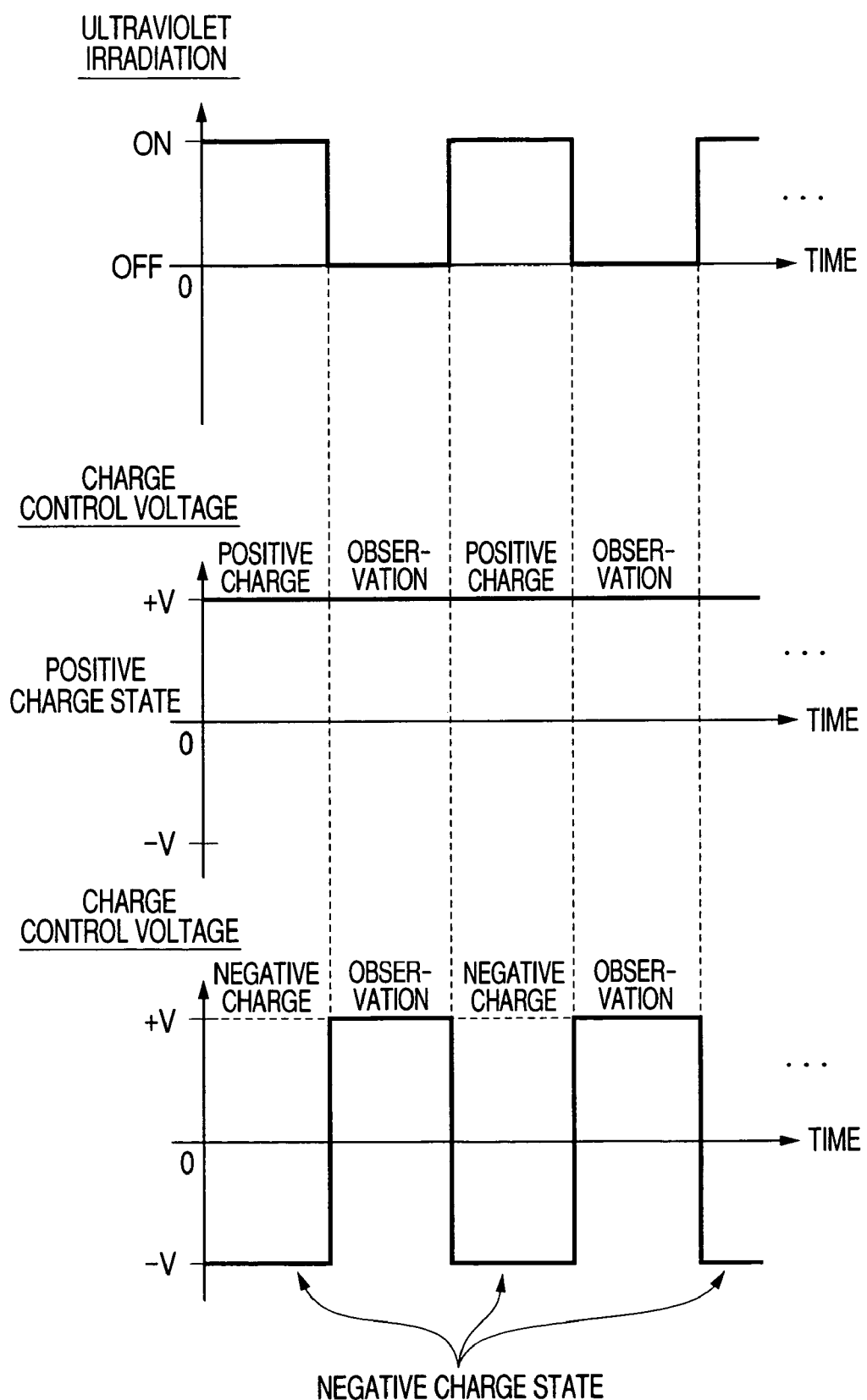
FIG. 13 shows a timing chart for ultraviolet irradiation and control of charge control potential for acquiring an image just after a performance of charge control.
Figure 14:
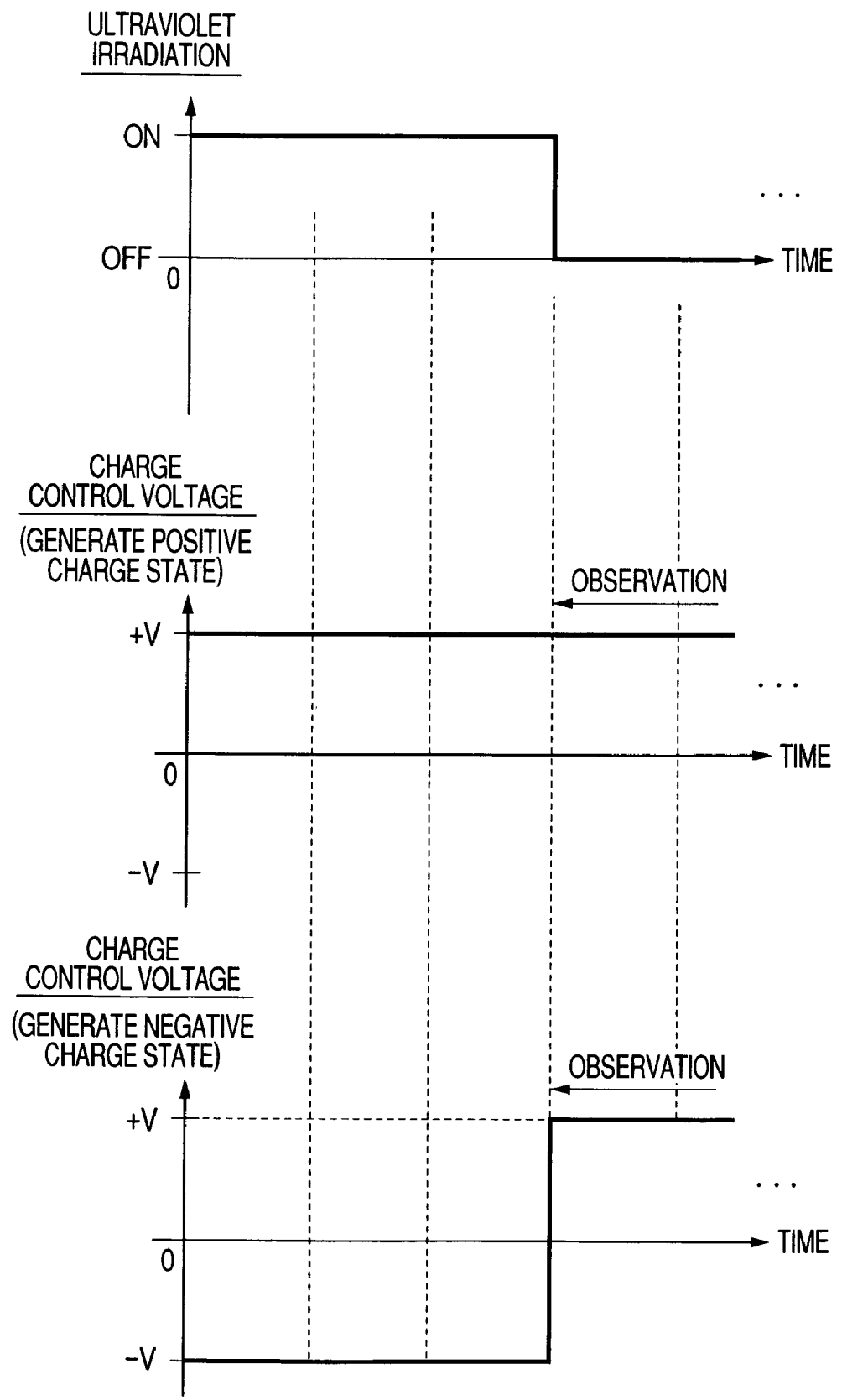
FIG. 14 shows a timing chart for ultraviolet irradiation and control of charge control potential for acquiring an image after performing charge control of the overall surface of the wafer.

Moving to the defect position, to get a uniform charge around the defect portion, at step 2408, while ultraviolet is irradiated, charge control potential and retarding potential are controlled. As shown in FIG. 12, by controlling the charge control potential so as for its absolute value to descend over time during the ultraviolet irradiation, a uniform charge around the defects portion was attained. After this operation, by performing ultraviolet irradiation with the charge control potential being set as shown in FIGS. 13 and 14, the wafer could be charged to any desired potential. By this charging, defects of contact holes like conductivity-fault defects and short defects become detectible.

Figure 6:
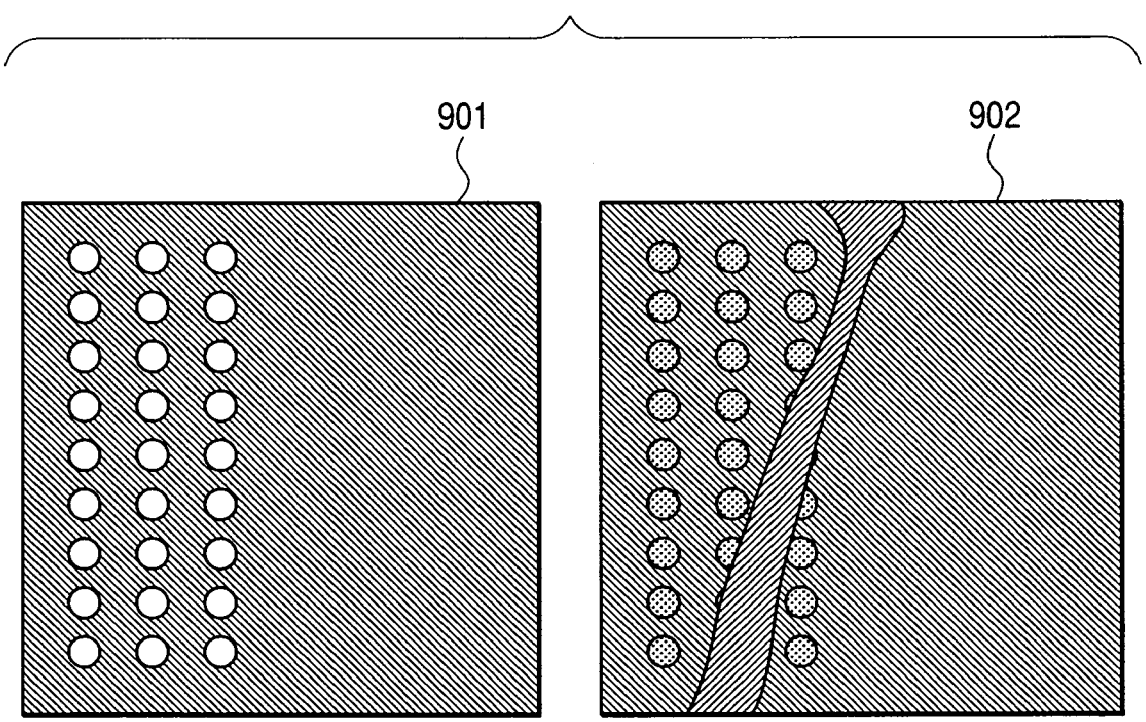
FIG. 6 shows the images with shading.
Figure 7:
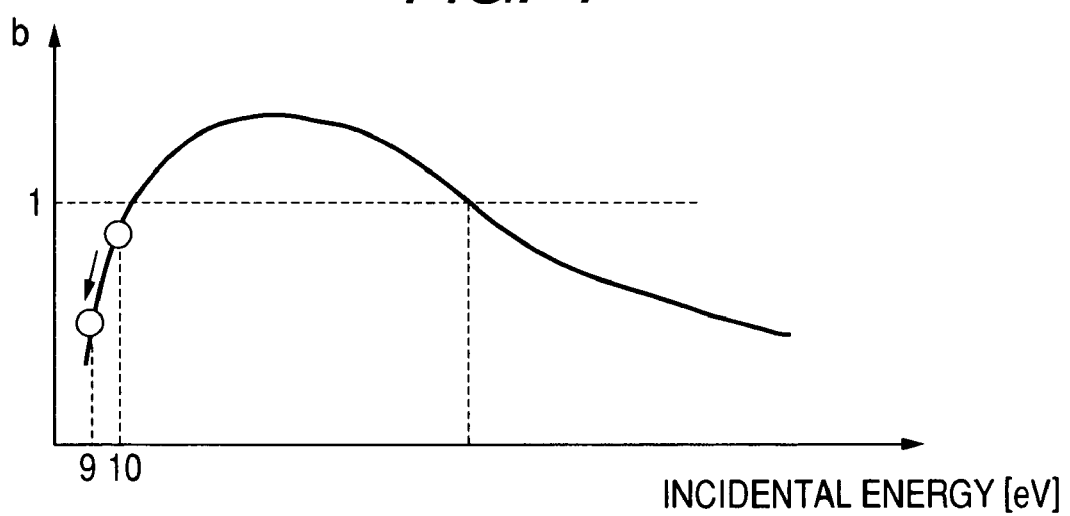
FIG. 7 is a graph for the efficiency of secondary electron emission.

After making the charge uniform, at step 2409, setting the charge control potential to be positive relative to the wafer as shown in FIG. 10, at step 2410 and 2411, the defect image is acquired. Although conventionally shading occurred as shown in FIG. 6, this method has got rid of shading.

Incidentally, in this embodiment of the present invention, each time an image is acquired, ultraviolet irradiation is performed, as shown in FIG. 15, to get a uniform charge around the defect portion for acquiring another image. This is realized by the method of charge control as shown in FIG. 13. First, to obtain a positive voltage contrast image, setting the charge control voltage to a positive voltage relative to the substrate, ultraviolet irradiation is performed. This allows the sample to charge to a desired potential, and then ceasing the ultraviolet irradiation, a positive voltage contrast image is acquired. At this time, as shown in FIG. 10, the charge control voltage is set positive relative to the substrate. The above described relation between the control of ultraviolet irradiation and the control of charge control voltage is like that illustrated as the time chart in the upper and middle part of FIG. 13.

Next, to obtain a negative voltage contrast image, setting the charge control voltage to a negative voltage relative to the substrate, ultraviolet irradiation is performed. This allows the sample to charge to a desired potential, and then ceasing the ultraviolet irradiation, a negative voltage contrast image is acquired. At this time, as shown in FIG. 10, the charge control voltage is set positive relative to the substrate.

The above described relation between the control of ultraviolet irradiation and the control of charge control voltage is like that illustrated as the time chart in the upper and lower part of FIG. 13. These actions are repeated for each defect to be observed as shown in FIG. 15. The on off of the ultraviolet irradiation is done by the ultraviolet light source control device 367, and the on off of the voltage application to the charge control electrode 337 is done by the electric power control unit 365. And the timing coordination between the actions of the ultraviolet light source control device 367 and the electric power control unit 365 is conducted by the control system 326.

Incidentally, other than the manner of charge control and image acquisition as shown in FIG. 15, another way may be to first irradiate ultraviolet as shown in FIG. 16 to have a uniform charge all over the wafer, and then acquire the image of the defect portion as shown in FIG. 17. The case of obtaining a positive voltage contrast image in the manner just mentioned above is explained with reference to FIG. 14. First, setting the charge control voltage to a desired positive voltage as shown in the time chart in middle of FIG. 14, ultraviolet is irradiated as shown in the time chart in the upper part of FIG. 14. At this time, ultraviolet is irradiated all over the wafer as shown in FIG. 16. Then, ceasing ultraviolet irradiation as the time chart in the upper part of FIG. 14 shows, and keeping the charge control voltage positive relative to the substrate, observation of the defect is conducted one by one.

Next, the case of obtaining a negative voltage contrast image is explained with reference to FIG. 14. First, setting the charge control voltage to a desired negative voltage as shown in the time chart in the lower part of FIG. 14, the ultraviolet is irradiated as shown in the time chart in the upper part of FIG. 14. At this time, the ultraviolet is irradiated all over the wafer as shown in FIG. 16. Then, ceasing ultraviolet irradiation as the time chart in the upper part of FIG. 14 shows, and setting the charge control voltage positive relative to the substrate, the observation of the defect is conducted one by one.

At step 2411, the high-magnification images acquired are stored in the image/data storing unit 350 if necessary. It is to be set beforehand in the review parameter file whether to store them or not. It would be possible, if necessary, to store several kinds of images taken simultaneously by plurality of detectors according to the specification. For example, an image by the secondary electrons detected by the second detector 332 and the image by the reflected electrons detected by the first detector 331 can be stored at the same time.

At step 2412, at the same time as storing the images, the image processing unit 349 extracts the characteristics of the defects from the image information, and automatically classify the contents of the defects. The classification results are, for example, coded with numerical numbers 1 to 255, which code numbers are written into the location corresponding to the defect classification code in the inspection results file.

The above described defect-review operation is repeated in the following routine as shown in step 2416: move to the defect position (step 2407)→ultraviolet irradiation and setting charge control potential and retarding potential for a uniform charge(step 2408)→setting charge control potential and retarding potential for image acquisition (step 2409) →beam irradiation (step 2410)→image acquisition (step 2411)→defects classification (step 2412).

Completing above described series of actions for all the defects assigned for reviewing on a wafer, the inspection results file (the file written in with the classification codes) is automatically stored and output to a designated place, and at step 2414, the wafer is unloaded, and the review comes to the end at step 2415.

Using this method, resolved is the conventionally unresolved problem of degraded inspection accuracy and the shading accompanying the image acquisition that came from the residual charge a wafer has before inspection.

Embodiment 5

In accordance with this embodiment of the present invention, will be explained below the method of reviewing defects with a view SEM and classifying them based on the defects-position information output by the inspection apparatus described in the first embodiment, taking up a contact-hole pattern case as an example. There is the case of acquiring both positive and negative contrast images in order to classify residues at the bottom of a contact hole, shape defects and conductivity fault defects.

At step 2410, as shown in FIG. 23, first a positive contrast image 2601 is acquired by setting the potential difference (Δ Vcc) between the charge control electrode and the wafer at 1000V, thereby detecting a foreign particle 2605 and a shape defect 2606.

Then, by setting Δ Vcc at −5V to produce a potential barrier to the secondary electrons, the electrons once emitted are drawn back to the wafer and charge the wafer negative. If an image is acquired at this stage, since the trajectory of the secondary electrons gets diverged due to the lack of an electric field to draw up the secondary electrons from the wafer, a negative voltage contrast image 2602 with shading is obtained.

Therefore, in this embodiment, in order to obtain an image without shading, Δ Vcc was set at 2000V to generate an electric field to draw up the secondary electrons. Then an image without shading 2603 was obtained extracting or detecting a conductivity fault defect 2607. Then, in order to identify the cause of the conductivity fault defect 2607, a positive voltage contrast image 2604 of the bottom of the contact hole is acquired. At this point of the process, although Δ Vcc is set at 2000V to draw up the secondary electrons from the bottom of the contact hole, conventionally it took time to attain a positive voltage contrast because there was a residual negative voltage on the wafer. In this case, the residual negative charge was removed by irradiating ultraviolet for 0.1 s, and a positive charge contrast image 2604 was obtained. From the result, adhesion of a foreign particle 2608 was identified as the cause of the conductivity fault defect.

In summary, according to conventional technologies, which didn't take into account the charge on the wafer when acquiring an image, images with shading or distorted images would be obtained. According to the method of this embodiment of the present invention, by switching the charge control potential applied to the charge control electrode from negative to positive at the times of charge control and image acquisition, eliminated is generation of shading, and is drastically reduced the probability of obtaining distorted images.

Incidentally, although a charge control electrode was used for charging the wafer negative in this embodiment, precharge by a flood-gun or the ultraviolet irradiation may be used instead.

What is claimed is:

1. A scanning electron microscope in which a primary electron beam is scanned on a sample loaded on a sample stage, and secondary electrons for creating an image are detected, comprising:
   a charge control electrode to which voltage for controlling a charged state of the sample is applied; and
   an ultraviolet irradiation device for irradiating ultraviolet light onto the sample.

2. A scanning electron microscope according to claim 1, wherein the electron beam is scanned by an electro optical unit, and further comprising control means for enabling switching of the ultraviolet irradiation by the ultraviolet irradiation device and switching of the scan of the electron beam by the electro optical unit.

3. A scanning electron microscope according to claim 1, wherein the control means enables switching on and off of the ultraviolet irradiation by the ultraviolet irradiation device.

4. A scanning electron microscope according to claim 1, further comprising a monitoring unit which displays an image based on signals of the secondary electrons which are detected after the ultraviolet irradiation device irradiates ultraviolet light onto a whole surface of the sample.

5. A scanning electron microscope according to claim 1, further comprising control means for enabling switching between the ultraviolet irradiation by the ultraviolet irradiation device and the voltage applied to the charge control electrode.

6. A scanning electron microscope according to claim 5, wherein the control means enables switching on and off of the ultraviolet irradiation by the ultraviolet irradiation device.

7. A semiconductor sample inspection apparatus in which a primary electron beam is scanned on a sample loaded on a sample stage, and secondary electrons for generating a detection signal are detected, comprising:

a charge control electrode to which voltage for controlling a charged state of the sample is applied;

an ultraviolet irradiation system for removing residual charge from a whole surface of the sample by an irradiation of ultraviolet light;

means for applying a retarding voltage to the sample stage or the sample; and an image processing unit to inspect the sample based on said detection signal.

8. A semiconductor sample inspection apparatus according to claim 7, wherein the electron beam is scanned by an electro optical unit, and further comprising control means for enabling switching of the ultraviolet irradiation by the ultraviolet irradiation system and switching of the scan of the electron beam by the electro optical unit.

9. A semiconductor sample inspection apparatus according to claim 8, wherein the control means enables switching on and off of the ultraviolet irradiation by the ultraviolet irradiation system.

10. A semiconductor sample inspection apparatus according to claim 7, wherein the image processing unit inspects the sample based on an image signal detected from the detection signal after the ultraviolet irradiation to the whole surface of the sample has been implemented.

11. A semiconductor sample inspection apparatus according to claim 7, further comprising control means for enabling switching between the ultraviolet irradiation by the ultraviolet irradiation system and the voltage applied to the charge control electrode.

12. A semiconductor sample inspection apparatus according to claim 11, wherein the control means enables switching on and off of the ultraviolet irradiation by the ultraviolet irradiation system.

13. A semiconductor sample inspection apparatus in which a primary electron beam is scanned on a sample loaded on a sample stage, and secondary electrons for generating a detection signal are detected, the sample being one of a semiconductor, a chip, and a circuit pattern formed on a semiconductor substrate, comprising:

a charge control electrode to which voltage for controlling a charged state of the sample is applied;

an ultraviolet irradiation system for removing residual charge from the sample by an irradiation of ultraviolet light;

a retarding electric source to apply a retarding voltage to the sample stage or the sample; and an image processing unit to inspect the sample based on the detection signal.

14. A semiconductor sample inspection apparatus according to claim 13, wherein the electron beam is scanned by an electro optical unit, and further comprising control means for enabling switching of the ultraviolet irradiation by the ultraviolet irradiation system and switching of the scan of the electron beam by the electro optical unit.

15. A semiconductor sample inspection apparatus according to claim 14, wherein the control means enables switching on and off of the ultraviolet irradiation by the ultraviolet irradiation device.

16. A semiconductor sample inspection apparatus according to claim 13, wherein the sample is a chip, and wherein the image processing unit inspects a specific chip based on an image signal detected from the detection signal after the ultraviolet irradiation of a whole surface of the specific chip has been implemented.

17. A semiconductor sample inspection apparatus according to claim 13, further comprising control means for enabling switching between the ultraviolet irradiation by the ultraviolet irradiation system and the voltage applied to the charge control electrode.

18. A semiconductor sample inspection apparatus according to claim 17, wherein the control means enables switching on and off of the ultraviolet irradiation by the ultraviolet irradiation system.

19. A scanning electron microscope, according to claim 1, further comprising means for applying a retarding voltage to the sample stage or the sample.

\* \* \* \* \*